US011282703B2

(12) United States Patent
Claridge et al.

(10) Patent No.: US 11,282,703 B2
(45) Date of Patent: Mar. 22, 2022

(54) PREPARATION OF AN ARRAY OF ULTRA-NARROW NANOWIRES ON FUNCTIONALIZED 2D MATERIALS AND USES THEREOF

(71) Applicant: Purdue Research Foundation, West Lafayette, IN (US)

(72) Inventors: Shelley A. Claridge, Lafayette, IN (US); Ashlin Porter, Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 202 days.

(21) Appl. No.: 16/818,857

(22) Filed: Mar. 13, 2020

(65) Prior Publication Data

US 2020/0402799 A1    Dec. 24, 2020

Related U.S. Application Data

(60) Provisional application No. 62/818,833, filed on Mar. 15, 2019.

(51) Int. Cl.
| | | |
|---|---|---|
| *H01L 21/02* | (2006.01) | |
| *H01L 29/06* | (2006.01) | |
| *B82Y 40/00* | (2011.01) | |
| *B82Y 10/00* | (2011.01) | |
| *B82Y 30/00* | (2011.01) | |

(52) U.S. Cl.
CPC .. *H01L 21/02603* (2013.01); *H01L 21/02425* (2013.01); *H01L 21/02628* (2013.01); *H01L 21/02658* (2013.01); *H01L 29/0669* (2013.01); *B82Y 10/00* (2013.01); *B82Y 30/00* (2013.01); *B82Y 40/00* (2013.01)

(58) Field of Classification Search
CPC ......... H01L 21/02603; H01L 21/02425; H01L 21/02628; H01L 21/02658; H01L 29/0669; B82Y 10/00; B82Y 30/00; B82Y 40/00
USPC .............................................. 257/9; 438/610
See application file for complete search history.

(56) References Cited

U.S. PATENT DOCUMENTS

| | | | |
|---|---|---|---|
| 2011/0162870 A1* | 7/2011 | Markovich | ......... C23C 18/1676 |
| | | | 174/126.1 |
| 2014/0220773 A1* | 8/2014 | Tour | .................. H01L 29/66742 |
| | | | 438/610 |

OTHER PUBLICATIONS

Claridge, S., et al, "Cluster-Assembled Materials", ACS Nano., 2009, 3, pp. 244-255.
(Continued)

*Primary Examiner* — David Vu
*Assistant Examiner* — Brandon C Fox
(74) *Attorney, Agent, or Firm* — Purdue Research Foundation; Liang Zeng Yan

(57) ABSTRACT

The present invention generally relates to a method for preparing structurally unique nanomaterials and the products thereof. In particular, the present invention discloses a method for preparing an array of ultra-narrow nanowire or nanorod on a patterned monolayer supported by a 2D material substrate in a controlled environment, wherein said pattered monolayer comprises a polymerizable amphiphiles such as phospholipid with a terminal amine and wherein said controlled environment comprises a major nonpolar solvent, a trace amount of polar solvent, and a unsaturated aliphatic amine. Gold nanowires (AuNWs) so prepared have a highly controlled diameter of about 2 nm, a length up to about 1000 nm, and an AuNW ordering over an area >100 µm².

20 Claims, 15 Drawing Sheets

(56) References Cited

OTHER PUBLICATIONS

Reiser, B., et al, "Spinning Hierarchical Gold Nanowire Microfibers by Shear Alignment and Intermolecular Self-Assembly", ACS Nano., 2017, 11, pp. 4934-4942.
Glor, E., et al, "Out-of-Plane Orientation Alignment and Reorientation Dynamics of Gold Nanorods in Polymer Composite Films", Soft Matt., 2017, 13, pp. 2207-2215.
Geng, Y., et al, "A Template-Confined Fabrication of Controllable Gold Nanoparticles Based on the Two-Dimensional Nanostructure of Macrocycles", Chem. Comm., 2015, 51, pp. 6820-6823.
Cui, D., et al "Solution and Air Stable Host/Guest Architectures from a Single Layer Covalent Organic Framework", Chem. Comm., 2015, 51, pp. 16510-3.
Iritani, K, et al, "Host-Guest Chemistry in Integrated Porous Space Formed by Molecular Self-Assembly at Liquid-Solid Interfaces", Langmuir, 2017, 33, pp. 4601-4618.
Tahara, K., et al, "Functionalized Surface-Confined Pores: Guest Binding Directed by Lateral Noncovalent Interactions at the Solid-Liquid Interface", ACS Nano., 2014, 8, pp. 8683-8694.
Claridge, S., "Standing, Lying, and Sitting: Translating Building Principles of the Cell Membrane to Synthetic 2D Material Interfaces", Chem. Comm., 2018, 54, pp. 6681-6691.
Mann, J., et al, "Noncovalent Functionalization of Graphene by Molecular and Polymeric Adsorbates", J. Phys. Chem. Lett., 2013, 4, pp. 2649-2657.
Giridharagopal, R., et al, "Substrate-Dependent Properties of Polydiacetylene Nanowires on Graphite and MoS2", ACS Nano., 2008, 2, pp. 1571-1580.
Okawa, Y., et al, "Controlled Chain Polymerisation and Chemical Soldering for Single-Molecule Electronics", Nanoscale, 2012, 4, pp. 3013-3028.
Bang, J., et al, "Spatially Controlled Noncovalent Functionalization of 2D Materials Based on Molecular Architecture", Langmuir, 2018, 34, pp. 5454-5463.
Jiang, H., et al, "Dramatic Shape Modulation of Surfactant/Diacetylene Microstructures at the Air-Water Interface", Chem. Eur. J., 2014, 20, pp. 16747-16752.
Yang, Y., et al, "Shape-Directed Patterning and Surface Reaction of Tetra-Diacetylene Monolayers: Formation of Linear and Two-Dimensional Grid Polydiacetylene Alternating Copolymers", Langmuir, 2014, 31, pp. 12408-12416.
Li, B., et al, "Self-Assembled Air-Stable Supramolecular Porous Networks on Graphene", ACS Nano., 2016, 7, pp. 10764-10772.
Bang, J., et al., "Sitting Phases of Polymerizable Amphiphiles for Controlled Functionalization of Layered Materials", J. Am. Chem. Soc., 2016,138, pp. 4448-4457.
Choong, S., et al., "Sitting Phase Monolayers of Polymerizable Phospholipids Create Dimensional, Molecular-Scale Wetting Control for Scalable Solution Based Patterning of Layered Materials", ACS Appl. Mater. Interf., 2017, 9, pp. 19326-19334.
Villarreal, T., et al, "Modulating Wettability of Layered Materials by Controlling Ligand Polar Headgroup Dynamics", J. Am Chem. Soc., 2017, 139, pp. 11973-11979.
Hayes, T., et al, "Multimicrometer Noncovalent Monolayer Domains on Layered Materials through Thermally Controlled Langmuir-Schaefer Conversion for Noncovalent 2D Functionalization", ACS Appl. Mater. Interf., 2017, 9, pp. 36409-36416.
Davis, T., et al., "Functionalization of 2D Materials by Controlled Langmuir-Schaefer Conversion", Langmuir., 2018, 34, pp. 1353-1362.

\* cited by examiner (C) polar channels created by environmental H$_2$O and OM in solution (D) AuNW bundles disperse and strongly orient on PE/H$_2$O/OM stripes

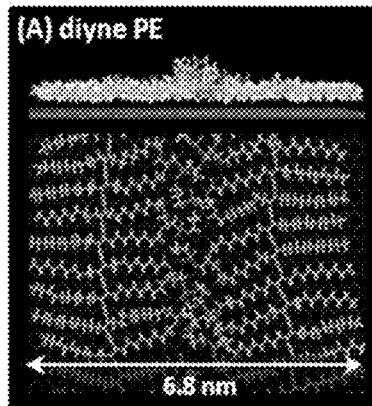 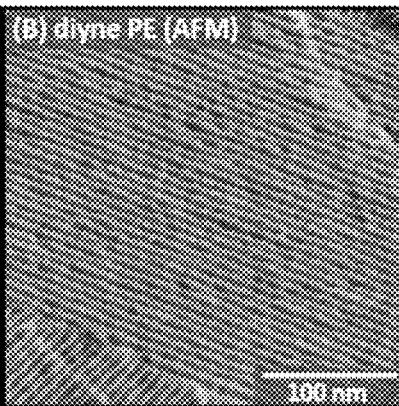 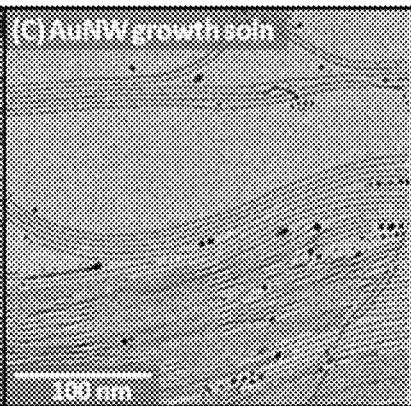
Fig. 2A  Fig. 2B  Fig. 2C
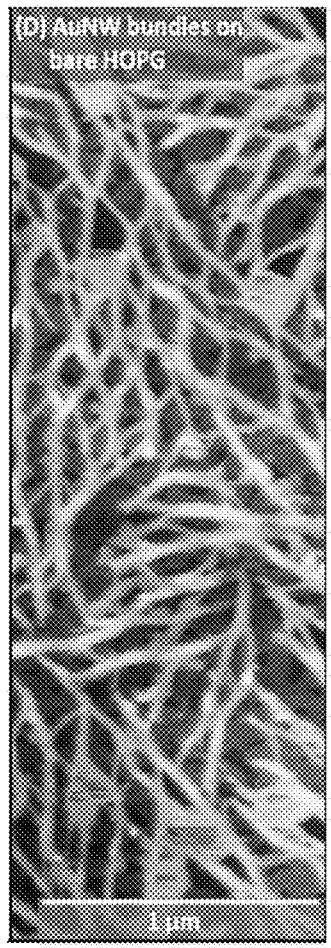
Fig. 2D

Fig. 4L
Fig. 4M
Fig. 4N
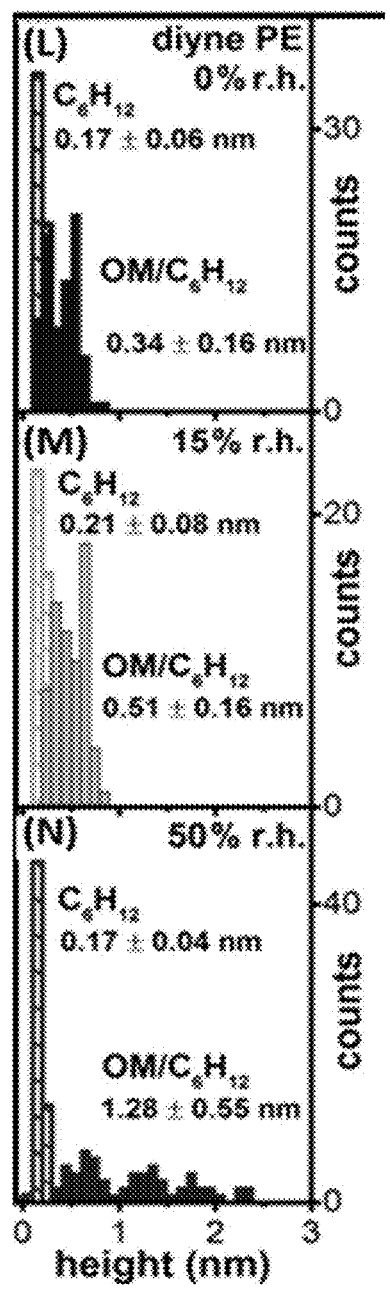
Fig. 4O
Fig. 4P
Fig. 4Q
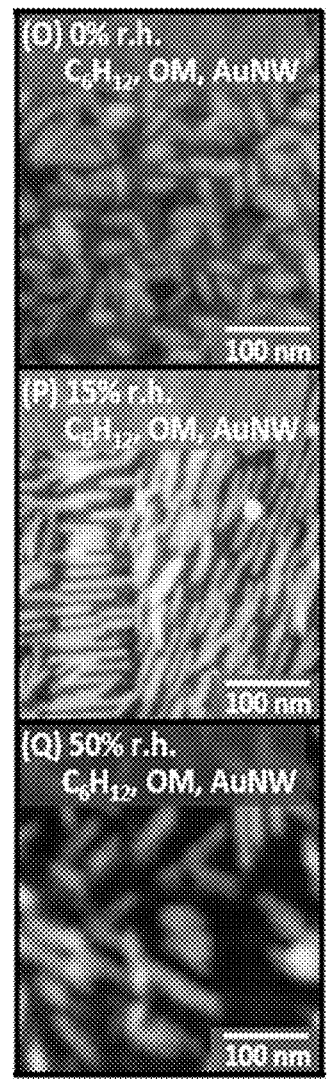

PREPARATION OF AN ARRAY OF ULTRA-NARROW NANOWIRES ON FUNCTIONALIZED 2D MATERIALS AND USES THEREOF

CROSS REFERENCE TO RELATED APPLICATIONS

This present patent application relates to and claims the priority benefit of U.S. Provisional Application Ser. No. 62/818,833, filed Mar. 15, 2019, the content of which is hereby incorporated by reference in its entirety into this instant disclosure.

GOVERNMENT SUPPORT CLAUSE

This invention was made with government support under grant N66001-17-1-4046 awarded by the Defense Advanced Research Projects Agency (DARPA). The government has certain rights in the invention.

TECHNICAL FIELD

This invention generally relates to a method for growing an array of ultra-narrow nanowires or nanorods on a functionalized supporting 2D material substrate, more specifically to a method for growing an array of ultra-narrow nanowires or nanorods on a non-covalently functionalized supporting 2D material substrate using a polymerizable lipid amphiphile.

BACKGROUND

This section introduces aspects that may help facilitate a better understanding of the disclosure. Accordingly, these statements are to be read in this light and are not to be understood as admissions about what is or is not prior art.

Integrating graphene with into functional hybrids materials and devices increasingly requires the capability to structure and template interactions with the environment across a range of length scales (Mann, J. A., et al., J. Phys. Chem. Lett 2013, 4, 2649-2657; MacLeod, J. M., et al., Small 2014, 10, 1038-1049; Bang, J. J., et al., J. Am. Chem. Soc. 2016, 138, 4448-4457). Noncovalent ligand chemistries are frequently desirable in functionalizing 2D materials because they do not disrupt electronic conjugation within the basal plane; however, this raises the challenge of stabilizing the monolayer toward solvents exposure and other common processing conditions.

Noncovalent monolayer chemistries are widely used in controlling surface chemistry of layered materials. Integrating functionalized 2D materials into multilayer device architectures suggests the need for functionalization strategies that are not only robust toward solution or vacuum processing, but also enables spatially controlled interactions with other materials in a hybrid. Synergistic with this need, lying down phases of functional alkanes commonly used in non-covalent functionalization present 1-nm-wide rows of paired functional headgroups separated by ~5 nm stripes of exposed alkane chains.

Most recently much research is being dedicated to study nanoscale objects, and attempts have been made to build nanoscale objects in a controlled manner (Stasiak, et al, U.S. Pat. No. 7,597,814, 2009; Kamins, U.S. Pat. No. 7,446,024, 2008). Nanowires have potential uses in nanoelectronic, nanophotonic, and sensing devices. For many applications, the diameter of the nanowire must be controlled. There is a clear need for new technologies that will fabricate nanowires or nano rods in a controlled manner at micro and nano scales.

Scientists looking to investigate the smallest of physical structures at a nanoscale have a range of tools at their disposal. Two of the most common are Atomic Force Microscopy (AFM) and Scanning Electron Microscopy (SEM). While both techniques are capable of providing nanometer-scale information about a material, they are very different methods, and can be used to reveal different kinds of information.

Atomic Force Microscopy. Developed in the 1980s, AFM uses a sharp tip on a cantilever which reads across a surface. It can be thought of as a sort of phonograph, capable of sensing the smallest variations on the surface of a material. As the AFM probe scans, a laser aimed at the non-contact side of the cantilever measures the amount of interaction between the tip and the sample. With this setup, AFM is able to determine the surface topography of a material on the atomic scale vertically, and the nanometer scale horizontally.

Scanning Electron Microscopy. Put into practice in the 1960s, SEM uses a focused beam of electrons, rather than a laser beam, to generate an image. An electron gun at the top of the microscope generates the beam of electrons, which travels down through a vacuum. As it travels toward the sample, the electron beam is focused by a series of lenses and electromagnetic fields. When the beam strikes the sample, it releases X-rays and electrons, which are detected and converted into a three-dimensional image.

Significant differences between AFM and SEM arise when it comes to creating a representation of a sample surface. On atomically smooth surfaces, AFM is capable of producing a three-dimensional topography using just a single scan. AFM also provides a greater level of detail for these surfaces, as SEM is not as efficient in resolving the subtle changes on a highly smooth surface.

On relatively rough surfaces, SEM's large depth of field gives it a significant advantage over AFM. If a sample has details that are millimeters high, the penetration of the electron beam used in SEM makes it possible to images those details. SEM also has a distinct advantage over AFM when it comes to determining the composition of a material. When the electron beam strikes a sample, a number of different signals are emitted, including back-scattered electrons, secondary electrons, X-rays, and light.

BRIEF SUMMARY OF INVENTIONS

This invention generally relates to a method for growing an array of ultra-narrow nanowires or nanorods on a functionalized 2D material substrate. Functionalization of the substrate employs a polymerizable lipid amphiphile.

In some illustrative embodiments, this invention relates to a method for preparing an array of ultra-narrow nanowires or nanorods on a non-covalently functionalized supporting 2D material substrate comprising the steps of a. preparing a polymerizable amphiphile comprising both hydrophobic and hydrophilic constituents;
 b. preparing a supporting 2D material substrate;
 c. preparing a monolayer or thin film of said polymerizable amphiphile on said supporting 2D material substrate, wherein said hydrophobic and hydrophilic constituents of the polymerizable amphiphile are exposed in such a way to form a striped pattern of nanometer scale;
 d. polymerizing said amphiphile monolayer to afford a polymerized monolayer or thin film on said supporting 2D material substrate to afford a non-covalently functionalized supporting 2D material substrate;

e. curing said amphiphilic monolayer in an environment with controlled humidity;

f. preparing a salt solution or suspension and growing nanowires or nanorods in the salt solution; and g. exposing said nanowires or nanorods to said polymerized amphiphile monolayer or thin film on said supporting 2D material substrate, whereby an oriented array of said nanowires or nanorods is produced.

In some illustrative embodiments, this invention relates to a method for preparing an array of ultra-narrow nanowires or nanorods on a non-covalently functionalized supporting 2D material substrate as disclosed herein, wherein said salt is a metal salt.

In some illustrative embodiments, this invention relates to a method for preparing an array of ultra-narrow nanowires or nanorods on a non-covalently functionalized supporting 2D material substrate as disclosed herein, wherein said metal salt is a gold or silver salt.

In some illustrative embodiments, this invention relates to a method for preparing an array of ultra-narrow nanowires or nanorods on a non-covalently functionalized supporting 2D material substrate as disclosed herein, wherein said salt solution or suspension comprises a non-polar solvent or a mixture thereof.

In some illustrative embodiments, this invention relates to a method for preparing an array of ultra-narrow nanowires or nanorods on a non-covalently functionalized supporting 2D material substrate as disclosed herein, wherein said salt solution or suspension comprises cyclohexane, oleylamine, triisopropylsilane and a gold or silver salt.

In some illustrative embodiments, this invention relates to a method for preparing an array of ultra-narrow nanowires or nanorods on a non-covalently functionalized supporting 2D material substrate as disclosed herein, wherein said gold salt is $HAuCl_4 \cdot 3H_2O$.

In some illustrative embodiments, this invention relates to a method for preparing an array of ultra-narrow nanowires or nanorods on a non-covalently functionalized supporting 2D material substrate as disclosed herein, wherein said salt solution comprises about 1-1000 mM of oleylamine.

In some illustrative embodiments, this invention relates to a method for preparing an array of ultra-narrow nanowires or nanorods on a non-covalently functionalized supporting 2D material substrate as disclosed herein, wherein said salt solution comprises about 10-1000 mM of triisopropylsilane.

In some illustrative embodiments, this invention relates to a method for preparing an array of ultra-narrow nanowires or nanorods on a non-covalently functionalized supporting 2D material substrate as disclosed herein, wherein said salt solution comprises about 0.1-10 mM of a gold salt.

In some illustrative embodiments, this invention relates to a method for preparing an array of ultra-narrow nanowires or nanorods on a non-covalently functionalized supporting 2D material substrate as disclosed herein, wherein said polymerization of an amphiphile monolayer or thin film is performed by irradiating with an UV light.

In some illustrative embodiments, this invention relates to a method for preparing an array of ultra-narrow nanowires or nanorods on a non-covalently functionalized supporting 2D material substrate as disclosed herein, wherein said supporting 2D material substrate is graphene, highly oriented pyrolytic graphite (HOPG), or a layered material comprising $MoS_2$ or $WS_2$.

In some illustrative embodiments, this invention relates to a method for preparing an array of ultra-narrow nanowires or nanorods on a non-covalently functionalized supporting 2D material substrate as disclosed herein, wherein said polymerizable amphiphile is a polymerizable phospholipid.

In some illustrative embodiments, this invention relates to a method for preparing an array of ultra-narrow nanowires or nanorods on a non-covalently functionalized supporting 2D material substrate as disclosed herein, wherein said polymerizable amphiphile is a single-chain fatty amine or dual-chain phospholipid with a terminal amine, or other polymerizable amphiphile with a polar headgroup including functionalities such as a carboxylic acid, phosphate, or thiol.

In some illustrative embodiments, this invention relates to a method for preparing an array of ultra-narrow nanowires or nanorods on a non-covalently functionalized supporting 2D material substrate as disclosed herein, wherein said polymerizable single-chain amphiphile is 4,6-pentacosadiyneamine or 10,12-pentacosa-diynamine.

In some illustrative embodiments, this invention relates to a method for preparing an array of ultra-narrow nanowires or nanorods on a non-covalently functionalized supporting 2D material substrate as disclosed herein, wherein said dual-chain amphiphile is 1,2-bis(10,12-tricosadiynoyl)-sn-glycero-3-phosphocholine (diyne PC), 1,2-bis(10,12-tricosadiynoyl)-sn-glycero-3-phosphoethanolamine (diyne PE), or other like polymerizable amphiphile.

In some other illustrative embodiments, this invention relates to an array of ultra-narrow nanowires or nanorods on a non-covalently functionalized supporting 2D material substrate manufactured according to the methods disclosed herein.

In some other illustrative embodiments, this invention relates to an array of ultra-narrow nanowires or nanorods on a non-covalently functionalized supporting 2D material substrate manufactured according to a method comprising the steps of a. preparing a polymerizable amphiphile comprising both hydrophobic and hydrophilic constituents;

b. preparing a supporting 2D material substrate;

c. preparing a monolayer or thin film of said polymerizable amphiphile on said supporting 2D material substrate, wherein said hydrophobic and hydrophilic constituents of the polymerizable amphiphile are exposed in such a way to form a striped pattern of nanometer scale;

d. polymerizing said amphiphile monolayer to afford a polymerized monolayer or thin film on said supporting 2D material substrate to afford a non-covalently functionalized supporting 2D material substrate;

e. curing said amphiphilic monolayer in an environment with controlled humidity;

f. preparing a salt solution or suspension and growing nanowires or nanorods in the salt solution; and g. exposing said nanowires or nanorods to said polymerized amphiphile monolayer or thin film on said supporting 2D material substrate, whereby an oriented array of said nanowires or nanorods is produced.

In some other illustrative embodiments, this invention relates to an array of ultra-narrow nanowires or nanorods on a non-covalently functionalized supporting 2D material substrate manufactured according to the methods disclosed herein, wherein said salt is a metal salt.

In some other illustrative embodiments, this invention relates to an array of ultra-narrow nanowires or nanorods on a non-covalently functionalized supporting 2D material substrate manufactured according to the methods disclosed herein, wherein said metal salt is a silver or gold salt.

In some other illustrative embodiments, this invention relates to an array of ultra-narrow nanowires or nanorods on a non-covalently functionalized supporting 2D material substrate manufactured according to the methods disclosed herein, wherein said supporting 2D material substrate is graphene, highly oriented pyrolytic graphite (HOPG), or a layered material such as $MoS_2$ or $WS_2$.

In some other illustrative embodiments, this invention relates to an array of ultra-narrow nanowires or nanorods on a non-covalently functionalized supporting 2D material substrate manufactured according to the methods disclosed herein, wherein said salt solution or suspension comprises a non-polar solvent or a mixture thereof.

In some other illustrative embodiments, this invention relates to an array of ultra-narrow nanowires or nanorods on a non-covalently functionalized supporting 2D material substrate manufactured according to the methods disclosed herein, wherein said salt solution or suspension comprises cyclohexane, oleylamine, triisopropylsilane and a gold or silver salt.

In some other illustrative embodiments, this invention relates to an array of ultra-narrow nanowires or nanorods on a non-covalently functionalized supporting 2D material substrate manufactured according to the methods disclosed herein, wherein said polymerization of an amphiphile monolayer or thin film is performed by irradiating with an UV light.

In some other illustrative embodiments, this invention relates to an array of ultra-narrow nanowires or nanorods on a non-covalently functionalized supporting 2D material substrate manufactured according to the methods disclosed herein, wherein said supporting 2D material substrate is graphene, highly oriented pyrolytic graphite (HOPG), or a layered material such as $MoS_2$ or $WS_2$.

In some other illustrative embodiments, this invention relates to an array of ultra-narrow nanowires or nanorods on a non-covalently functionalized supporting 2D material substrate manufactured according to the methods disclosed herein, wherein said polymerizable amphiphile is a polymerizable phospholipid.

In some other illustrative embodiments, this invention relates to an array of ultra-narrow nanowires or nanorods on a non-covalently functionalized supporting 2D material substrate manufactured according to the methods disclosed herein, wherein said polymerizable amphiphile is a single-chain fatty amine, a dual-chain phospholipid with a terminal amine, or other polymerizable amphiphile with a polar headgroup including functionalities such as a carboxylic acid, phosphate, or thiol.

In some other illustrative embodiments, this invention relates to an array of ultra-narrow nanowires or nanorods on a non-covalently functionalized supporting 2D material substrate manufactured according to the methods disclosed herein, wherein said polymerizable single-chain amphiphile is 4,6-pentacosadiyneamine or 10,12-pentacosa-diynamine.

In some other illustrative embodiments, this invention relates to an array of ultra-narrow nanowires or nanorods on a non-covalently functionalized supporting 2D material substrate manufactured according to the methods disclosed herein, wherein said dual-chain amphiphile is 1,2-bis(10,12-tricosadiynoyl)-sn-glycero-3-phosphocholine (diyne PC), 1,2-bis(10,12-tricosadiynoyl)-sn-glycero-3-phosphoethanolamine (diyne PE), or other like polymerizable amphiphile.

BRIEF DESCRIPTION OF THE DRAWINGS

Embodiments of the present disclosure will now be described by way of example in greater detail with reference to the attached figures, in which:

FIG. 1A shows the structure of diyne PE, illustrating flexibly oriented dipole. FIG. 1B shows the schematic of sitting phase of diyne PE and photopolymerization of diyne to stabilize noncovalently adsorbed monolayer. FIG. 1C illustrates the environmental hydration to create water layer around PE headgroups, and inverse micelle of oleylamine that forms around water layer in AuNW growth solution. FIG. 1D illustrates the well-separated AuNW arrays that form on striped diyne PE templates from AuNWs that form bundles in solution.

FIGS. 2A-2F show images of striped phase and AuNW structures, and templated AuNW assembly. FIG. 2A shows side and top view molecular models. FIG. 2B shows AFM phase image of diyne PE lamellar phase on HOPG. FIG. 2C shows TEM image of AuNW growth solution comprising both wires and spheres. FIG. 2D shows AuNW bundles deposited on HOPG. FIG. 2E and FIG. 2F show AuNW bundles and arrays of discrete AuNW on diyne PE template.

(FIG. 3F) Time distributions of center-to-center distances and AuNW surface densities. (FIG. 3G) Large-area SEM image illustrating AuNW alignment.

FIGS. 4A-4Q demonstrate AuNW assembly on diyne PE with varying environmental humidity. FIGS. 4A-4E depict minimized molecular models of hydrated diyne PE on HOPG with $H_2O$:diyne PE ratios of 1:1 to 16:1, shown as side views (left) and top views (right). (FIGS. 4L-4N) Lamellar height distributions for templates immersed in pure $C_6H_{12}$ (dashed bars) and $OM/C_6H_{12}$ (solid bars). (FIGS. 4O-4Q) Ambient AFM images of AuNW assembly on diyne PE templates maintained at (FIG. 4O) 0% r.h., (FIG. 4P) 15% r.h., or (FIG. 4Q) 50% r.h. prior to exposure to AuNW solution.

FIG. 7G shows line scans taken from images FIGS. 7A-7B illustrating the difference in center-to-center distance for wires assembled on diyne PE and 4,6-PCD-$NH_2$.

DETAILED DESCRIPTION

Figure 1A:
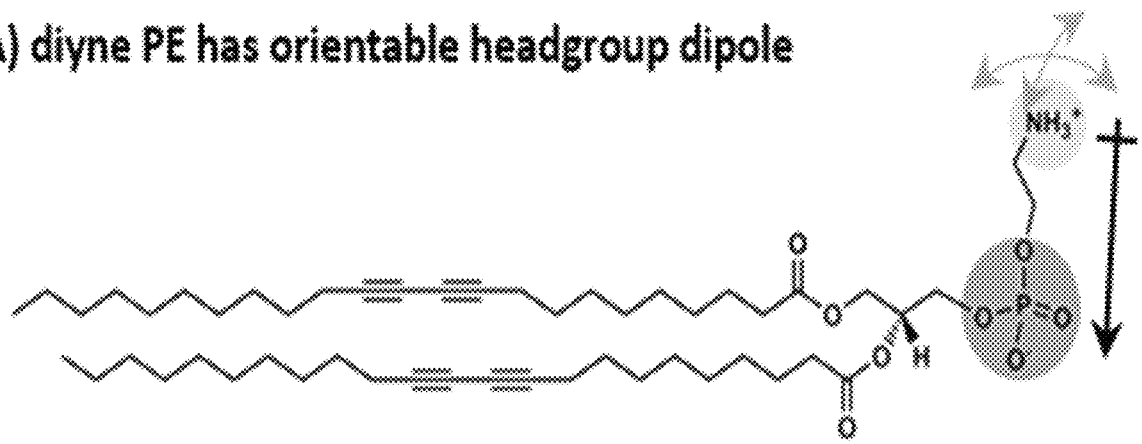
FIGS. 1A-1D illustrate AuNW assembly on phospholipid striped phases.
Figure 1B:
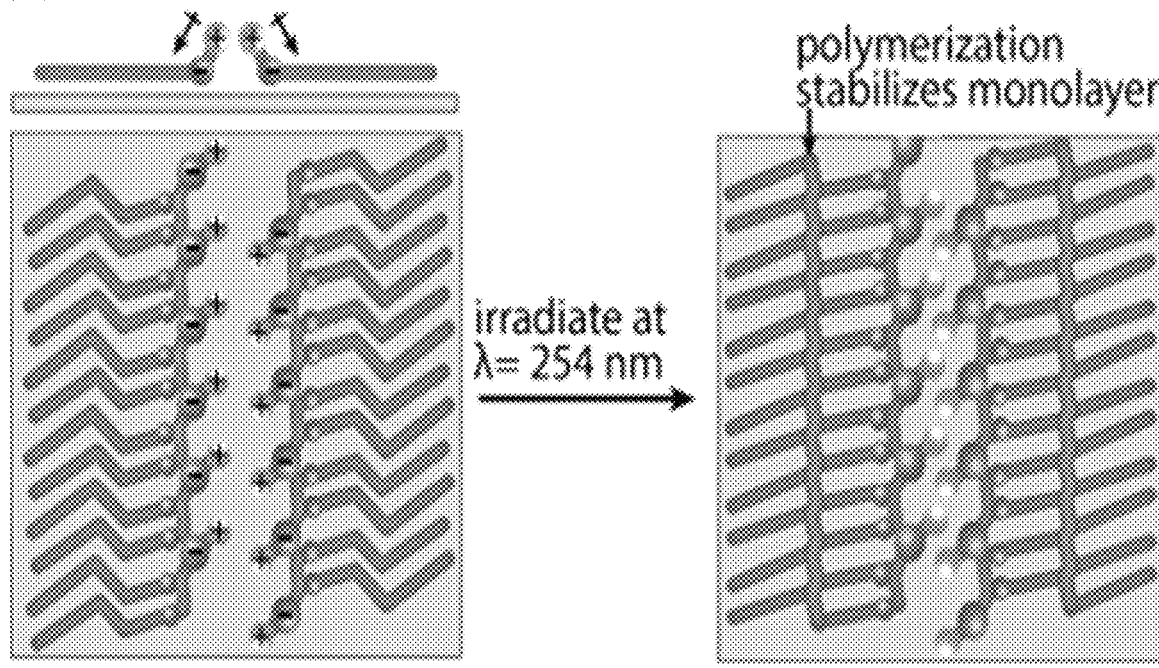

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure the term "about" can allow for a degree of variability in a value or range, for example, within 20%, within 10%, within 5%, or within 1% of a stated value or of a stated limit of a range.

In the present disclosure the term "substantial" or "substantially" can allow for a degree of variability in a value or range, for example, within 80%, within 90%, within 95%, or within 99% of a stated value or of a stated limit of a range.

In this document, the terms "a," "an," or "the" are used to include one or more than one unless the context clearly dictates otherwise. The term "or" is used to refer to a nonexclusive "or" unless otherwise indicated. In addition, it is to be understood that the phraseology or terminology employed herein, and not otherwise defined, is for the purpose of description only and not of limitation. Any use of section headings is intended to aid reading of the document and is not to be interpreted as limiting. Further, information that is relevant to a section heading may occur within or outside of that particular section. Furthermore, all publications, patents, and patent documents referred to in this document are incorporated by reference herein in their entirety, as though individually incorporated by reference. In the event of inconsistent usages between this document and those documents so incorporated by reference, the usage in the incorporated references should be considered supplementary to that of this document; for irreconcilable inconsistencies, the usage in this document controls.

As used herein, an "amphiphile" is defined as a chemical compound comprising both hydrophilic and hydrophobic constituents.

As used herein, a "thin film" is defined as a layer of material ranging from less than 1 nm to several thousand nanometers in thickness.

As disclosed herein, a suspension is a heterogeneous mixture that contains solid or liquid particles sufficiently large for sedimentation. The particles may be visible to the naked eye, usually must be larger than 1 micrometer, and will eventually settle. A suspension is a heterogeneous mixture in which the solute particles do not dissolve, but get suspended throughout the bulk of the solvent, left floating around freely in the medium. The internal phase (solid or liquid) is dispersed throughout the external phase (fluid) through mechanical agitation, with the use of certain excipients or suspending agents. An example of a suspension would be sand in water or oil in water. The suspended particles are visible under a microscope and will settle over time if left undisturbed. A suspension is different from a solution, in which the dissolved substance (solute), and solvent and solute are homogeneously mixed.

A layered, or two-dimensional (2D) material generally has a layer thickness between one atomic layer and a few nm. Even though the existence of two-dimensional materials have been theorized since the 1940's (Wallace, P. R. *Phys. Rev.* 1947, 71, 622-634), it was not until 2004 that it was shown that these materials can be stable as freestanding sheets, by the isolation of individual graphene sheets (Novoselov, K. S. et al., *Science* 2004, 306, 666-669). Layers may be stacked to form macroscopic materials; for instance, highly oriented pyrolytic graphite (HOPG) consists of stacks of graphene layers.

This invention generally relates to a method for growing ultra-narrow nanowires on a non-covalently functionalized 2D material substrate. Non-covalent functionalization of the substrate employs a polymerizable lipid amphiphile.

In some aspects, this invention relates to a method for preparing an array of ultra-narrow nanowires or nanorods on a non-covalently functionalized supporting 2D material substrate comprising the steps of
  a. preparing a polymerizable amphiphile comprising both hydrophobic and hydrophilic constituents;
  b. preparing a supporting 2D material substrate;
  c. preparing a monolayer or thin film of said polymerizable amphiphile on said supporting 2D material substrate, wherein said hydrophobic and hydrophilic constituents of the polymerizable amphiphile are exposed in such a way to form a striped pattern of nanometer scale;
  d. polymerizing said amphiphile monolayer to afford a polymerized monolayer or thin film on said supporting 2D material substrate to afford a non-covalently functionalized supporting 2D material substrate;
  e. curing said amphiphilic monolayer in an environment with controlled humidity;
  f. preparing a salt solution or suspension and growing nanowires or nanorods in the salt solution; and
  g. exposing said nanowires or nanorods to said polymerized amphiphile monolayer or thin film on said supporting 2D material substrate, whereby an oriented array of said nanowires or nanorods is produced.

In some aspects, this invention relates to a method for preparing an array of ultra-narrow nanowires or nanorods on a non-covalently functionalized supporting 2D material substrate as disclosed herein, wherein said salt is a metal salt.

In some aspects, this invention relates to a method for preparing an array of ultra-narrow nanowires or nanorods on a non-covalently functionalized supporting 2D material substrate as disclosed herein, wherein said metal salt is a gold or silver salt.

In some aspects, this invention relates to a method for preparing an array of ultra-narrow nanowires or nanorods on a non-covalently functionalized supporting 2D material substrate as disclosed herein, wherein said salt solution or suspension comprises a non-polar solvent or a mixture thereof.

In some aspects, this invention relates to a method for preparing an array of ultra-narrow nanowires or nanorods on a non-covalently functionalized supporting 2D material substrate as disclosed herein, wherein said salt solution or suspension comprises cyclohexane, oleylamine, triisopropylsilane and a gold or silver salt.

In some aspects, this invention relates to a method for preparing an array of ultra-narrow nanowires or nanorods on a non-covalently functionalized supporting 2D material substrate as disclosed herein, wherein said gold salt is $HAuCl_4 \cdot 3H_2O$.

In some aspects, this invention relates to a method for preparing an array of ultra-narrow nanowires or nanorods on a non-covalently functionalized supporting 2D material substrate as disclosed herein, wherein said salt solution comprises about 1-1000 mM of oleylamine.

In some aspects, this invention relates to a method for preparing an array of ultra-narrow nanowires or nanorods on a non-covalently functionalized supporting 2D material substrate as disclosed herein, wherein said salt solution comprises about 10-1000 mM of triisopropylsilane.

In some aspects, this invention relates to a method for preparing an array of ultra-narrow nanowires or nanorods on a non-covalently functionalized supporting 2D material substrate as disclosed herein, wherein said salt solution comprises about 0.1-10 mM of a gold salt.

In some aspects, this invention relates to a method for preparing an array of ultra-narrow nanowires or nanorods on a non-covalently functionalized supporting 2D material substrate as disclosed herein, wherein said polymerization of an amphiphile monolayer or thin film is performed by irradiating with an UV light.

In some aspects, this invention relates to a method for preparing an array of ultra-narrow nanowires or nanorods on a non-covalently functionalized supporting 2D material substrate as disclosed herein, wherein said supporting 2D material substrate is graphene, highly oriented pyrolytic graphite (HOPG), or a layered material comprising $MoS_2$ or $WS_2$.

In some aspects, this invention relates to a method for preparing an array of ultra-narrow nanowires or nanorods on a non-covalently functionalized supporting 2D material substrate as disclosed herein, wherein said polymerizable amphiphile is a polymerizable phospholipid.

In some aspects, this invention relates to a method for preparing an array of ultra-narrow nanowires or nanorods on a non-covalently functionalized supporting 2D material substrate as disclosed herein, wherein said polymerizable amphiphile is a single-chain fatty amine or dual-chain phospholipid with a terminal amine, or other polymerizable amphiphile with a polar headgroup including functionalities such as a carboxylic acid, phosphate, or thiol.

In some aspects, this invention relates to a method for preparing an array of ultra-narrow nanowires or nanorods on a non-covalently functionalized supporting 2D material substrate as disclosed herein, wherein said polymerizable single-chain amphiphile is 4,6-pentacosadiyneamine or 10,12-pentacosa-diynamine.

In some aspects, this invention relates to a method for preparing an array of ultra-narrow nanowires or nanorods on a non-covalently functionalized supporting 2D material substrate as disclosed herein, wherein said dual-chain amphiphile is 1,2-bis(10,12-tricosadiynoyl)-sn-glycero-3-phosphocholine (diyne PC), 1,2-bis(10,12-tricosadiynoyl)-sn-glycero-3-phosphoethanolamine (diyne PE), or other like polymerizable amphiphile.

In some other aspects, this invention relates to an array of ultra-narrow nanowires or nanorods on a non-covalently functionalized supporting 2D material substrate manufactured according to the methods disclosed herein.

In some other aspects, this invention relates to an array of ultra-narrow nanowires or nanorods on a non-covalently functionalized supporting 2D material substrate manufactured according to a method comprising the steps of
  a. preparing a polymerizable amphiphile comprising both hydrophobic and hydrophilic constituents;
  b. preparing a supporting 2D material substrate;
  c. preparing a monolayer or thin film of said polymerizable amphiphile on said supporting 2D material substrate, wherein said hydrophobic and hydrophilic constituents of the polymerizable amphiphile are exposed in such a way to form a striped pattern of nanometer scale;
  d. polymerizing said amphiphile monolayer to afford a polymerized monolayer or thin film on said supporting 2D material substrate to afford a non-covalently functionalized supporting 2D material substrate;
  e. curing said amphiphilic monolayer in an environment with controlled humidity;
  f. preparing a salt solution or suspension and growing nanowires or nanorods in the salt solution; and
  g. exposing said nanowires or nanorods to said polymerized amphiphile monolayer or thin film on said supporting 2D material substrate, whereby an oriented array of said nanowires or nanorods is produced.

In some other aspects, this invention relates to an array of ultra-narrow nanowires or nanorods on a non-covalently functionalized supporting 2D material substrate manufactured according to the methods disclosed herein, wherein said salt is a metal salt.

In some other aspects, this invention relates to an array of ultra-narrow nanowires or nanorods on a non-covalently functionalized supporting 2D material substrate manufactured according to the methods disclosed herein, wherein said metal salt is a silver or gold salt.

In some other aspects, this invention relates to an array of ultra-narrow nanowires or nanorods on a non-covalently functionalized supporting 2D material substrate manufactured according to the methods disclosed herein, wherein said supporting 2D material substrate is graphene, highly oriented pyrolytic graphite (HOPG), or a layered material comprising $MoS_2$ or $WS_2$.

In some other aspects, this invention relates to an array of ultra-narrow nanowires or nanorods on a non-covalently functionalized supporting 2D material substrate manufactured according to the methods disclosed herein, wherein said salt solution or suspension comprises a non-polar solvent or a mixture thereof.

In some other aspects, this invention relates to an array of ultra-narrow nanowires or nanorods on a non-covalently functionalized supporting 2D material substrate manufactured according to the methods disclosed herein, wherein said salt solution or suspension comprises cyclohexane, oleylamine, triisopropylsilane and a gold or silver salt.

In some other aspects, this invention relates to an array of ultra-narrow nanowires or nanorods on a non-covalently functionalized supporting 2D material substrate manufactured according to the methods disclosed herein, wherein said gold salt is $HAuCl_4$.

In some other aspects, this invention relates to an array of ultra-narrow nanowires or nanorods on a non-covalently functionalized supporting 2D material substrate manufactured according to the methods disclosed herein, wherein said salt solution comprises about 1-1000 mM of oleylamine.

In some other aspects, this invention relates to an array of ultra-narrow nanowires or nanorods on a non-covalently functionalized supporting 2D material substrate manufactured according to the methods disclosed herein, wherein said salt solution comprises about 10-1000 mM of triisopropylsilane.

In some other aspects, this invention relates to an array of ultra-narrow nanowires or nanorods on a non-covalently functionalized supporting 2D material substrate manufactured according to the methods disclosed herein, wherein said salt solution comprises about 0.1-10 mM of a gold salt.

In some other aspects, this invention relates to an array of ultra-narrow nanowires or nanorods on a non-covalently functionalized supporting 2D material substrate manufactured according to the methods disclosed herein, wherein said polymerization of an amphiphile monolayer or thin film is performed by irradiating with an UV light.

In some other aspects, this invention relates to an array of ultra-narrow nanowires or nanorods on a non-covalently functionalized supporting 2D material substrate manufactured according to the methods disclosed herein, wherein said supporting 2D material substrate is graphene, highly oriented pyrolytic graphite (HOPG), or a layered material comprising $MoS_2$ or $WS_2$.

In some other aspects, this invention relates to an array of ultra-narrow nanowires or nanorods on a non-covalently functionalized supporting 2D material substrate manufactured according to the methods disclosed herein, wherein said polymerizable amphiphile is a polymerizable phospholipid.

In some other aspects, this invention relates to an array of ultra-narrow nanowires or nanorods on a non-covalently functionalized supporting 2D material substrate manufactured according to the methods disclosed herein, wherein said polymerizable amphiphile is a single-chain fatty amine, a dual-chain phospholipid with a terminal amine, or other polymerizable amphiphile with a polar headgroup including functionalities comprising a carboxylic acid, phosphate, or thiol.

In some other aspects, this invention relates to an array of ultra-narrow nanowires or nanorods on a non-covalently functionalized supporting 2D material substrate manufactured according to the methods disclosed herein, wherein said polymerizable single-chain amphiphile is 4,6-pentacosadiyneamine or 10,12-pentacosa-diynamine.

In some other aspects, this invention relates to an array of ultra-narrow nanowires or nanorods on a non-covalently functionalized supporting 2D material substrate manufactured according to the methods disclosed herein, wherein said dual-chain amphiphile is 1,2-bis(10,12-tricosadiynoyl)-sn-glycero-3-phosphocholine (diyne PC), 1,2-bis(10,12-tricosadiynoyl)-sn-glycero-3-phosphoethanolamine (diyne PE), or other like polymerizable amphiphile.

Integrating graphene into functional hybrids materials and devices increasingly requires the capability to structure and template interactions with the environment across a range of length scales. Noncovalent ligand chemistries are frequently desirable in functionalizing 2D materials because they do not disrupt electronic conjugation within the basal plane; however, this raises the challenge of stabilizing the monolayer toward solvents exposure and other common processing conditions (Mann, J. A., et al., *J. Phys. Chem. Lett* 2013, 4, 2649-2657; MacLeod, J. M., et al., *Small* 2014, 10, 1038-1049; Bang, J. J., et al., *J. Am. Chem. Soc.* 2016, 138, 4448-4457).

Amphiphiles with polymerizable internal diynes are especially promising in this regard. Long-chain diynes including 10,12-pentacosadiynoic acid (10,12-PCDA) assemble into ordered lying-down lamellar phases on HOPG and graphene when deposited either from organic solvents (e.g. $CHCl_3$) or via Langmuir-Schaefer transfer of molecules from a standing phase monolayer on water (Okawa, Y. et al., *J. Chem. Phys.* 2001, 115, 2317-2322; Grim, P. C. M., et al., *Angew. Chem. Int. Ed.* 1997, 36, 2601-2603; Okawa, Y. et al., *Nanoscale* 2012, 4, 3013-3028). In the lying-down phases, the alkyl chains orient along the axis of the graphitic basal plane, and headgroups pair along the lamellar center, forming carboxylic acid dimers in the case of 10,12-PCDA. Photopolymerization of the internal diyne using UV radiation then produces an ene-yne polymer backbone, which has been studied extensively in the context of molecular electronics (Grim, P. C. M. et al., 1997), but can also serve to stabilize the monolayer against solvent removal or exchange (Bang, J. J. et al. 2016). Similar assembly and photopolymerization can also be carried out with diynes having other classes of functional headgroups (e.g. 10,12-pentacosadiynamine, N-aminopropyl-10,12-tricosadiyn-amide)) (Jiang, H., et al., *Chem. Eur. J.* 2014, 20, 16747-16752).

In such monolayers, the rows of headgroups represent 1-nm wide functional patterns with a pitch that can be precisely tuned based on chain length (typical values 5-6 nm); pattern lengths can range up to multiple µm, depending on how the monolayer is assembled (Hayes, T. R. et al., *ACS Appl. Mater. Interf.* 2017, 9, 36409-36416). Recent work in our group has indicated that the steric availability of the headgroup, as well as other physical properties (e.g. tail-group hydrophobicity) can be tuned based on ligand architecture. Positioning the diyne near the functional head appears to disrupt headgroup ordering during polymerization, potentially making the headgroups more accessible as ligands. Similarly, horizontally-oriented striped phases of diynoic phospholipids (e.g. 23:2 10,12-diyne phosphoethanolamine, diyne PE) adopt a 'sitting' orientation in which the terminal functional group protrudes slightly from the interface. Our previous experiments indicate this orientation has substantial impacts on interfacial wetting, and the obligate headgroup protrusion also suggests utility as a functional template (Bang, J. J., et al., 2016; Davis, T. C. et al., *Langmuir* 2018, 34, 1353-1362; Choong, S. W. et al., *ACS Appl. Mater. Interf.* 2017, 9, 19326-19334).

Nanoscale patterning of interfaces with inorganic nanostructures is increasingly important in device fabrication and other applications. Controlling interfacial adsorption of anisotropic nanostructures, which can become trapped in undesired binding geometries (e.g. a rod adsorbing misaligned with a striped template), remains a significant challenge in bottom-up approaches to device fabrication. However, biological systems routinely control docking of complex objects at the cell membrane surface, utilizing phospholipids and other membrane constituents. For phospholipids, strong dipoles (~25 D) in zwitterionic headgroups can reorient in response to local electric fields, modulating membrane fluidity and directing interactions with the environment. Local dipole array polarization has been shown to impact binding of inorganic nanocrystals to lipid bilayers in aqueous environments (Wang, B, et al, *Proc. Natl. Acad. Sci. USA*, 2008, 105, 18171-18175).

Interestingly, 2D materials are often functionalized non-covalently with motifs including striped phases of horizontally-oriented amphiphiles (Mann, J. A., et al., *J. Am. Chem. Soc.* 2011, 133, 17614-17617; MacLeod, J. M. et al., *Small*, 2014, 10, 1038-1049). Striped phases resemble repeating cross-sections of the cell membrane, suggesting a mechanism for directing orientation of anisotropic objects, comprising rods, at the interface (FIG. 1). Diynes including 10,12-pentacosadiynoic acid (10,12-PCD-COOH) assemble into lying-down lamellar phases with paired headgroups on highly oriented pyrolytic graphite (HOPG) and graphene, creating 1-nm-wide stripes of headgroups with pitches (ca. 5-7 nm) prescribed by alkyl chain length (Claridge, S. A. *Chem. Comm.* 2018, 54, 6681-6691; Mann, J. A. et al., *J. Phys. Chem. Lett.* 2013, 4, 2640-2657; Bang, J J, et al., *Langmuir,* 2018, 34, 5454-5463). Photopolymerization of the diyne produces an ene-yne polymer backbone, which has been extensively utilized in molecular electronics studies, but also stabilizes the monolayer against solvent exchange (Giridharagopal, R. et al., *ACS Nano.* 2008, 2, 1571-1580).

Recently, we have found that in striped monolayers of diyne phospholipids (e.g. diyne phosphoethanolamine, FIG. 1A), the terminal ammonium functional group protrudes slightly from the surface, forming a 'sitting' geometry (FIG.

1B) (Bang J J, et al., *J. Am. Chem. Soc.* 2016, 138, 4448-4457). This protrusion means that the zwitterionic phosphate/ammonium headgroup can adopt a variety of orientations, forming orientable 1D dipole arrays. Aligned molecular domains can be >10 µm in edge length, depending on molecular structure and monolayer preparation methods (Hayes, T R et al., *ACS Appl. Mater. Interf.* 2017, 9, 36409-36416; Davis, T C, et al., *Langmuir*, 2018, 34, 1353-1362). Such arrays suggest the possibility of controlled interactions with inorganic nano structures in the environment, particularly in polarizing anisotropic structures comprising wires to impact orientation and alignment at an interface.

Figure 1C:
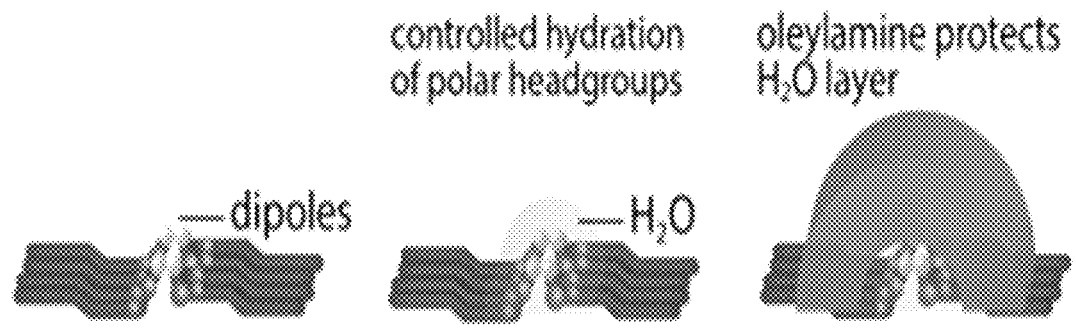
Figure 1D:
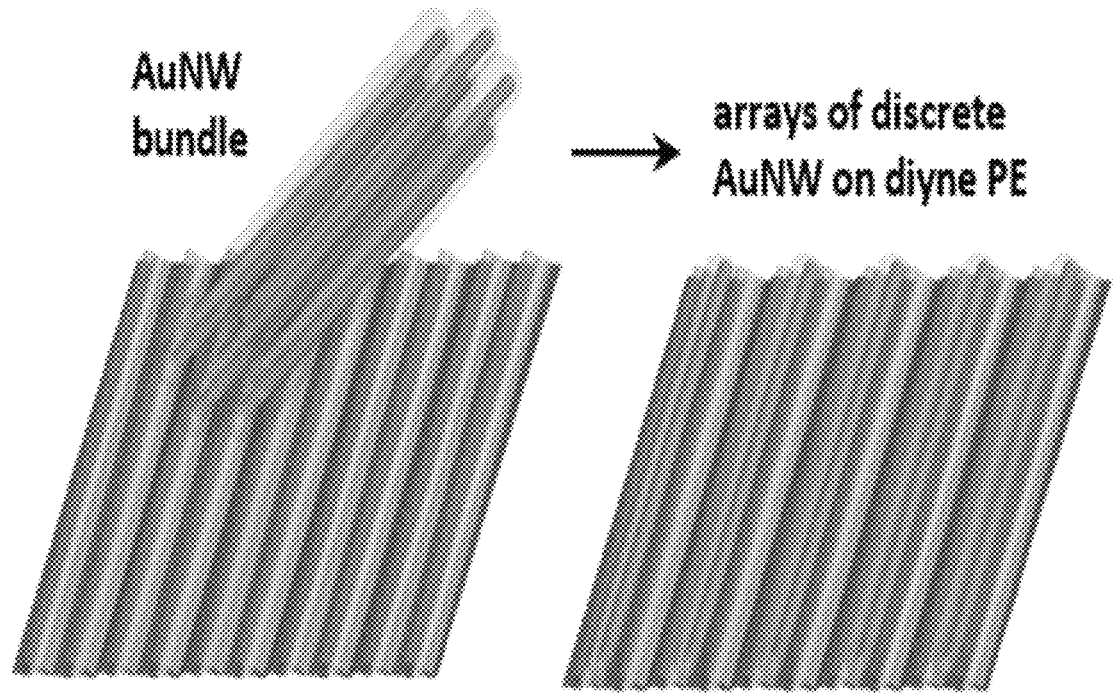

Here, we show that striped phases of phospholipids with 1-nm-wide rows of orientable headgroup dipoles can precisely orient and order narrow, flexible gold wires (Au diameter 1.5-2 nm), with lengths (>1 µm) substantially exceeding the template pitch (~6.8 nm). Arrays created in this way can extending over areas >100 µm². In the nonpolar solvent (cyclohexane) used here, ordering of AuNWs on the template depends on template hydration (FIG. 1C, middle), as well as the presence of excess oleylamine, which forms micelles on the striped surface (FIG. 1C, right). The protected polar environment immediately surrounding the headgroups would provide a reasonable means of enabling collective dipole orientation phenomena similar to those in the membrane periphery. Overall, these findings suggest new bioinspired principles for orienting and ordering long, flexible nanoscale objects over microscale areas (FIG. 1D), based on collective molecular interactions in a nanostructured template.

AuNW Synthesis and Assembly on Striped Diyne PE Templates

Striped templates of 1,2-bis(10,12-tricosadiynoyl)-sn-glycero-3-phosphoethanolamine (diyne PE) were prepared via Langmuir-Schaefer (LS) conversion, using a thermally regulated transfer stage we have reported previously to achieve areas with typical ordered domain edge lengths >1 µm (Hayes, T R et al., *ACS Appl. Mater. Interf.* 2017, 9, 36409-36416). Expected lamellar periodicities for such monolayers are ~6.8 nm (FIG. 2A), consistent with periodic structures observed in AFM images after transfer (FIG. 2B).

AuNWs were grown using a variation on literature procedure for ultra-narrow AuNW synthesis (Wang, C. et al., *J. Am. Chem. Soc.* 2008, 130, 8902-8903; Huo, Z Y, et al., *Nano Lett.* 2008, 8, 2041-2044), using solutions of $HAuCl_4 \cdot 3H_2O$, triisopropylsilane (TIPS), and oleylamine (OM) in cyclohexane. Solutions were aged for 12 h to allow for AuNW growth (FIG. 2C, see Experimental Methods for more detailed synthetic protocols) Similar procedures (typically using hexane as a solvent) have been shown previously to result in growth of AuNWs with diameters of 1.5-2 nm similar to those shown here, which form hexagonally-packed bundles in solution based on depletion attraction interactions between AuNW ligand shells (See refs. above). Lengths can be modified through choice of concentration or growth times; unless otherwise stated, AuNWs in templated deposition experiments reported here have average lengths of 902±336 nm.

Bare HOPG substrates exposed to AuNW solution for 2 h exhibit bundles of wires (FIG. 2D), consistent with previous reports (Venkatesh, R. et al., *Langmuir*, 2015, 31, 9246-9252). Excess OM from the growth solution appears to adsorb to the substrate, forming standing phases in regions between some bundles. On diyne PE templates, very different AuNW alignment is observed (FIG. 2E), with µm² areas of precisely-aligned individual wires in addition to areas of bundles. Higher-resolution AFM phase images (FIG. 2F) illustrate that wires are well-separated in areas in which the wire long axes are aligned with the stripe direction of the template. Center-to-center distances ($d_{cc}$) are 14 nm, 21 nm, or larger multiples of the template periodicity (6.8 nm)—substantially larger than reported $d_{cc}$ values for wires bundling in solution due to depletion attraction ($d_{cc}$=5.5-9.7 nm). Deposition on simple amine templates produces both bundling and $d_{cc}$ values ~7 nm, similar to the template pitch (see Supporting Information).

Figures 3A, 3B, 3C:
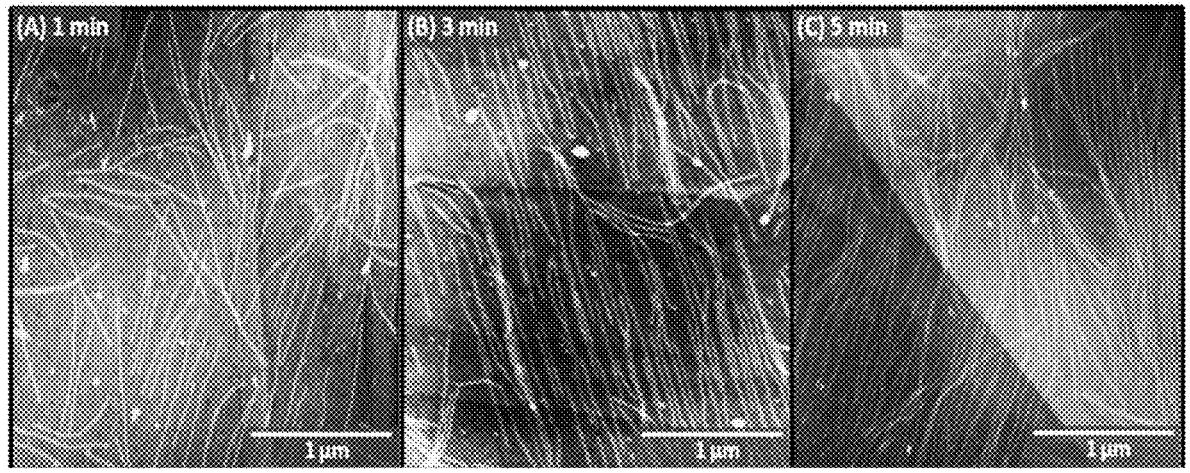
FIGS. 3A-3G show images of AuNW assembly on diyne PE templates at early time points. AFM images of AuNW bundles deposited on diyne PE templates for (FIG. 3A) 1 min, (FIG. 3B) 3 min, (FIG. 3C) 5 min, (FIG. 3D) 10 min, and (FIG. 3E) 15 min.
Figures 3D, 3E:
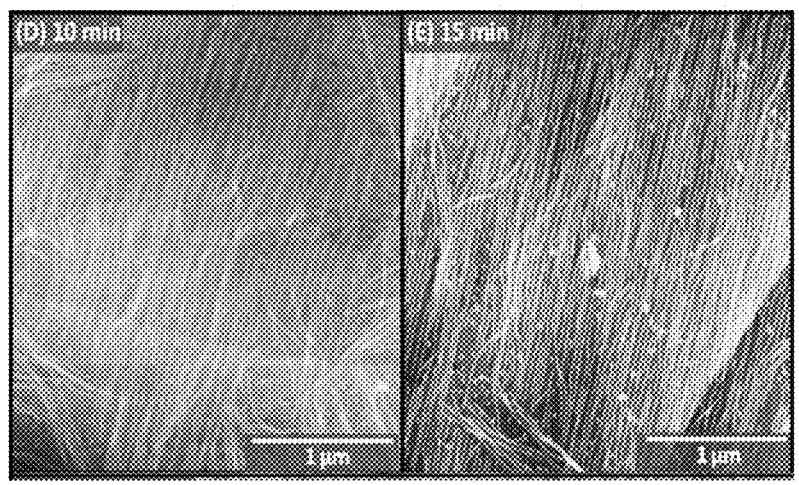
Figure 3F:
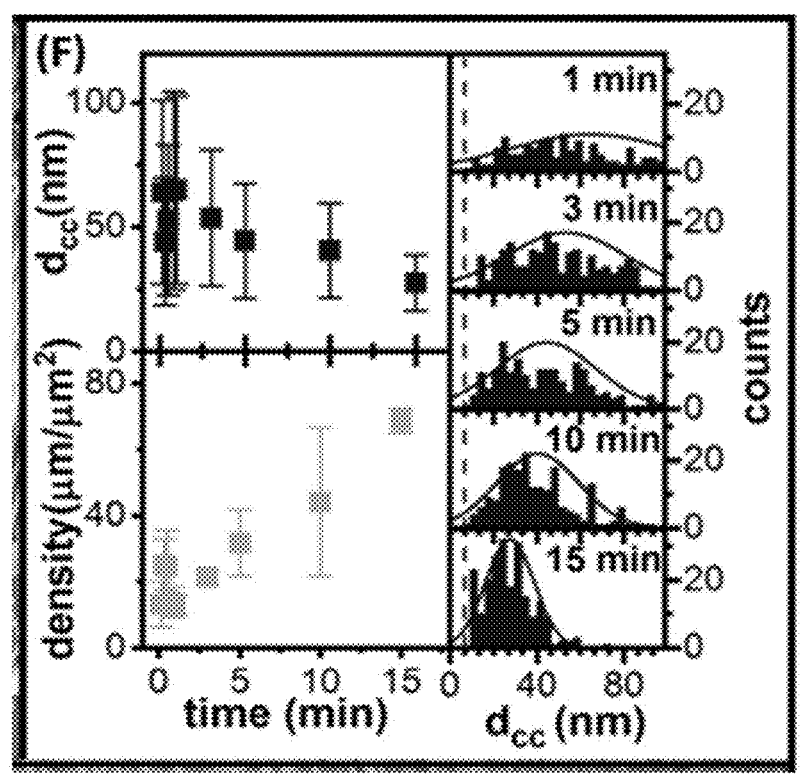

Probing the early stages of wire adsorption and assembly (FIG. 3) using diyne PE templates with large ordered domains, and diluted AuNW growth solution (41× dilution in cyclohexane, or ~27 µg Au/mL cyclohexane, for images shown here) reveals that adsorption proceeds rapidly, with 13±3 µm AuNW/µm² substrate after 1 min exposure to AuNW solution (FIG. 3A). Within the first 15 min of exposure, surface density of wires increases to 69±4 µm AuNW/µm² substrate (FIG. 3E), with average center-to-center distances of 27.5±11.2 nm. SEM images (FIG. 3B) illustrate that such ordering can extend over areas >100 µm². See Supporting Information for additional SEM images at higher magnification.

Dependence of Ordering on Template Hydration

We observed systematic variations in AuNW assembly with environmental humidity (vide infra). To understand likely geometries of water hydrating PE headgroups in the lab environment (before insertion into the AuNW/cyclohexane solution), we performed molecular dynamics simulations. Hydration limits for PE from natural sources range from ~20-40 wt %, or ~8-16 water molecules per headgroup. Minimized molecular models (FIG. 4A-E) illustrate side and top views of diyne PE on HOPG with 1 to 16 water molecules per diyne PE headgroup. At $H_2O$:diyne PE ratios <4:1, water forms small clusters along the headgroups after minimization, while at ratios ≥4, the water forms a contiguous channel connecting the headgroups.

Formation of OM Inverse Micelles Around Hydrated Headgroups

The presence of hydration shells around diyne PE headgroups in the laboratory environment would not guarantee continued hydration once the template was brought into contact with the AuNW/cyclohexane growth solution However, the AuNW growth solution also contains 32 mM OM; inverse hemicylindrical micelles of OM around the headgroups would represent a reasonable mechanism for maintaining headgroup hydration in the growth solution.

Figures 4A, 4B, 4C, 4D, 4E:
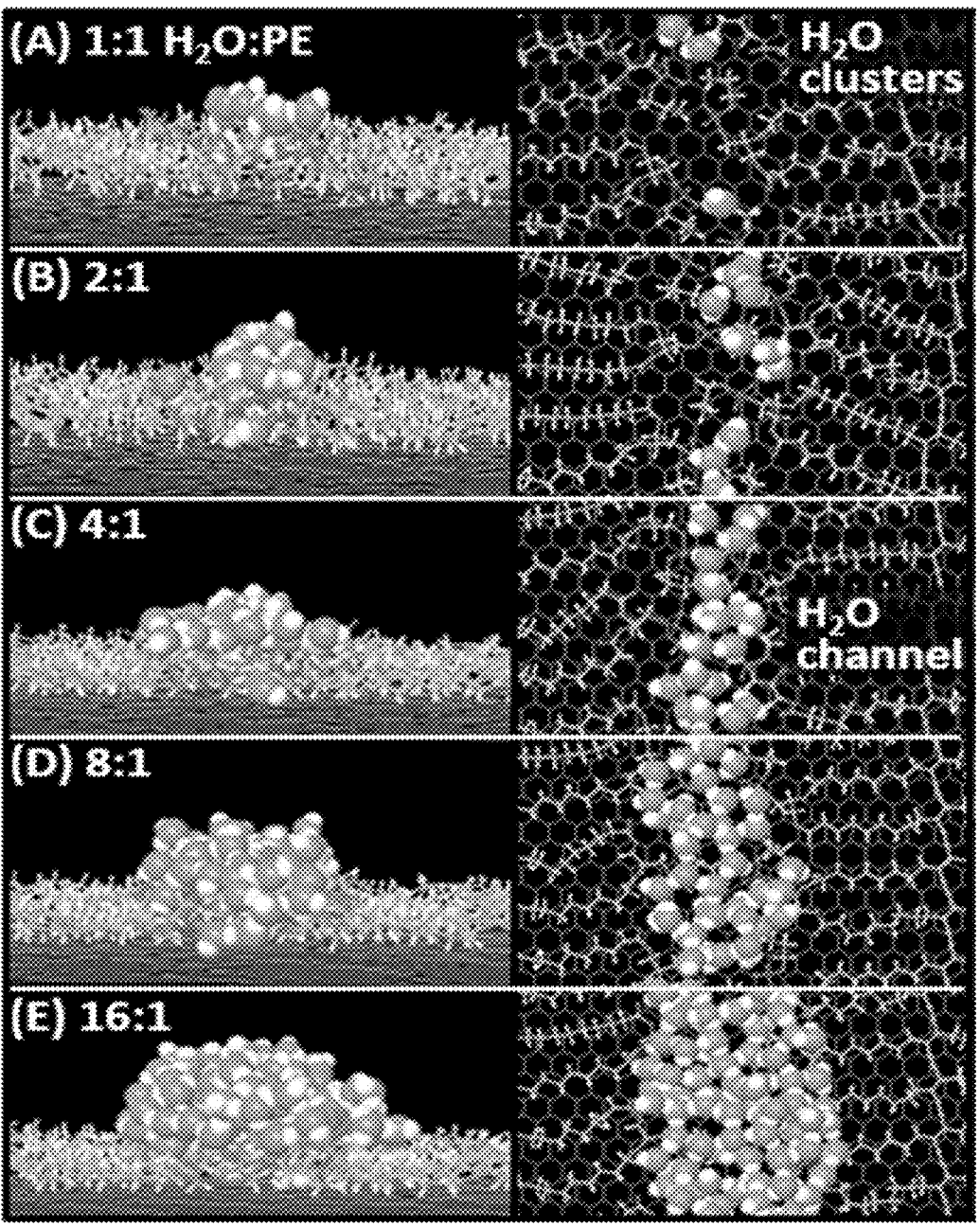
Figure 4F:
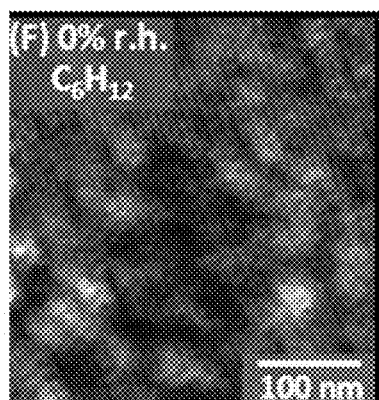
(FIGS. 4F-4K) Liquid cell AFM images of templates held at (FIGS. 4F,4I) 0%, (FIGS. 4G,4J) 15%, or (FIGS. 4H,4K) 50% r.h. prior to immersion in (FIGS. 4F-4H) pure cyclohexane or (FIGS. 4I-4K) 32 mM OM in cyclohexane.
Figure 4G:
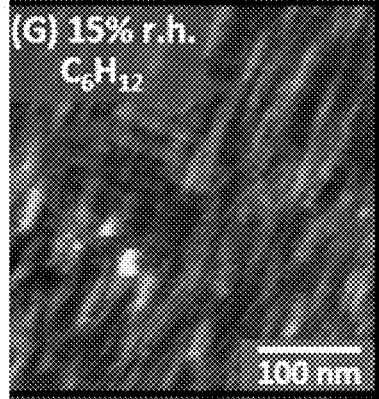
Figure 4H:
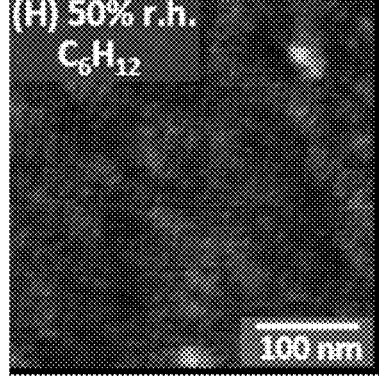
Figure 4I:
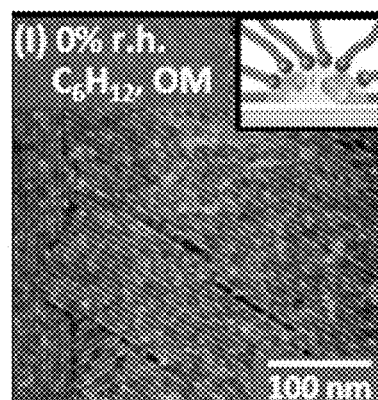
Figure 4J:
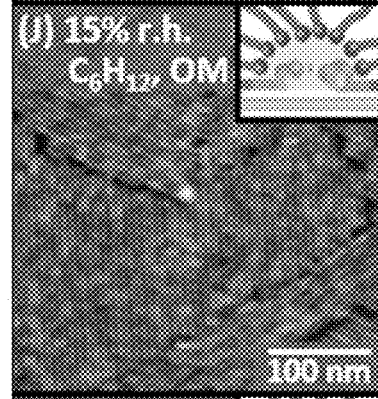
Figure 4K:
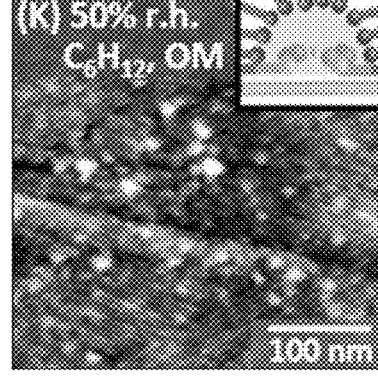

AFM images acquired in a liquid cell illustrate differences in topography for striped PE templates with varying degrees of hydration, placed in either pure cyclohexane (FIGS. 4F-4H and dashed bars in histograms in FIGS. 4L-4N) or 32 mM OM in cyclohexane (FIGS. 4I-4K, and solid bars in histograms). At all three humidity levels, exposure to pure cyclohexane results in faint striped topographic features of ~0.2±0.05 nm. Exposure to cyclohexane containing 32 mM OM produces well-resolved, taller topographic features at all humidity levels, with heights that increase with humidity: $\Delta h_{0\%}$=0.34±0.16 nm, $\Delta h_{15\%}$=0.51±0.16 nm, and $\Delta h_{50\%}$=1.28±0.55 nm. At 50% r.h., surface topography in the presence of OM ligands also becomes less regular, with hemispherical structures visible in addition to hemicylindrical micelles, presumably larger clusters of water passivated by OM.

Impact of Hydration on AuNW Ordering

We examined the impact of template hydration on AuNW ordering, using relatively short wires (average lengths 50-100 nm) with typical lengths substantially shorter than the template domain size, maximizing the extent to which local interactions with the template determine alignment. If diyne PE templates are equilibrated under vacuum (~0% r.h.) prior to being placed in contact with the AuNW solution, randomized wire orientations are observed (FIG. 4O), consistent with a process in which AuNW adsorb to the template and cannot reorient. Equilibration at 10-20% r.h. produces dense, highly oriented AuNW coverage (FIG. 4P). Equilibration at high humidity (~50% r.h.) reduces wire adsorption (FIG. 4Q).

Overall, this suggests that water molecules around the headgroups contribute to AuNW ordering, either by modulating the strength of the phospholipid headgroup dipoles or facilitating reorientation of the dipoles to interact with AuNWs during adsorption. Conversely, excess water appears to limit AuNW-template interactions.

In some other embodiments, it is understood that the film needs to expose both sections of the amphiphile, and to not specify that the film has to be transferred—in principle, we can assemble the molecular layer directly on the surface. An alternative embodiment is to assemble a molecular layer, for instance, through methods such as Langmuir-Schaefer conversion or dropcasting from organic solvents.

We grow the wires in a solution first, then expose them to the surface. Humidity is controlled after the monolayer is polymerized, before it is exposed to the metal salt solution. The optimal range of relative humidity, as for diyne PE, appears to be ~10-20%, but it may be different for other molecules, etc. And the range of the optimum humidity may be different for different supporting 2D substrates, comprising $MoS_2$ for an instance.

In some other embodiments, it is further understood that we can grow the nanorods or nanowires in solution first, then expose them to the non-covalently functionalized surface on a supporting 2D material substrate. The humidity of the functionalized, patterned surface is controlled after the monolayer is polymerized, before it is exposed to the metal salt solution with the growing nanorods and nanowires.

Dependence of Orientation on Headgroup Dipoles

Next, we tested whether other molecules with zwitterionic headgroups induced strong AuNW orientational ordering and center-to-center distances >7 nm. From the standpoint of headgroup dipoles, PE (FIG. 5A) represents an exceptional case: in standing phases (e.g. the cell membrane), the small size of the terminal primary amine enables formation of H-bonding networks between PE headgroups, increasing their lateral interaction strength (by ~7.2 kcal/mol·H-bond, based on $CH_3NH_2 \ldots HPO_4(CH_3)_2$) in comparison with PC (Vanderkooi, G. *J. Phys. Chem.* 1983, 87, 5121-5129). In aligning polarizable AuNWs, strong interactions with headgroup dipoles should be correlated with stronger nanowire ordering; ordering should also occur independent of whether the positive or negative end of the dipole was positioned further from the substrate. In these experiments, we again used shorter nanowires to maximize the extent to which the template controlled wire alignment.

Figures 5A, 5B, 5C, 5D:
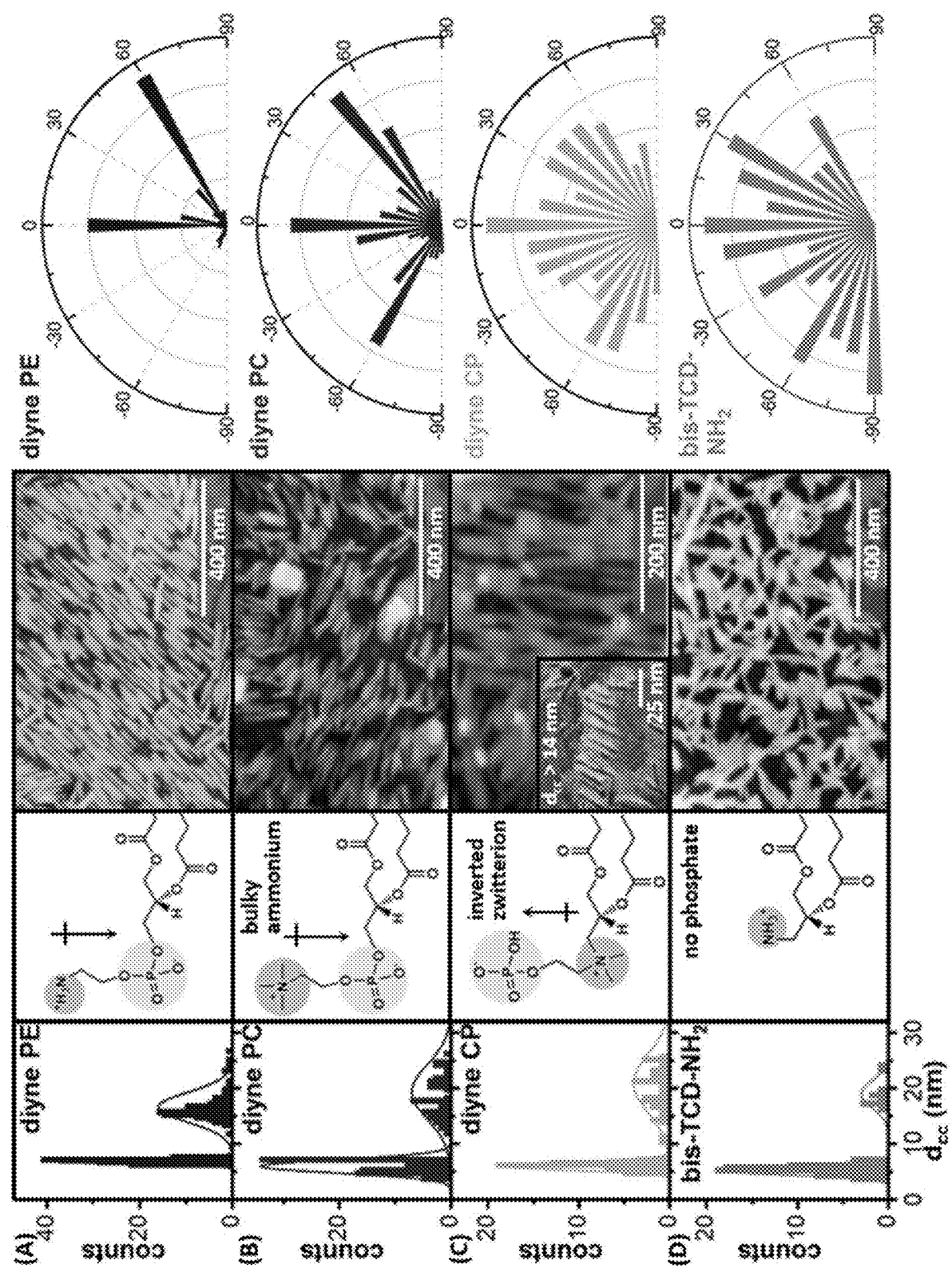
FIGS. 5A-5D demonstrate AuNW assembly on other striped amphiphilic templates. Histograms of $d_{cc}$ values (left), molecular structures (center left), AFM images (center right), and windrose plots of wire alignment (right) for the following molecules (FIG. 5A) diyne PE, (FIG. 5B) diyne PC, (FIG. 5C) diyne CP, and (FIG. 5D) bis-TCD-$NH_2$.

Diyne phosphocholine (diyne PC) terminates in a bulky quaternary ammonium group, which decreases dipole interaction strength relative to PE. Striped phases of diyne PC produce a large fraction of arrays with $d_{cc}$=14 nm (FIG. 5B); AuNW orientation (quantified in windrose plots) and ordering is weaker than that achieved on diyne PE templates (FIG. 5A), consistent with somewhat decreased dipole interaction strength.

Next, we examined whether AuNW adsorption required a positive charge to protrude from the interface, by synthesizing a diyne choline phosphate (diyne CP) lipid, with the quaternary ammonium at the base and a terminal phosphate. This molecule also promotes a high degree of AuNW adsorption (FIG. 5C), meaning that protruding positive charges are not a requirement for AuNW adsorption. Again, wire arrays with large center-to-center distances are evident (FIG. 5C inset).

Additionally, we synthesized an amphiphile including all elements of the PE headgroups above, apart from the phosphate, eliminating the orientable zwitterion. Templates assembled from this molecule, 3-(dimethylamino) propane-1,2-diyl bis(tricosa-10,12-diynoate) (bis-TCD-$NH_2$), produce wire adsorption without the large center-to-center distances characteristic of assembly on templates with headgroup dipoles. Lower degrees of orientational order were also observed (FIG. 5D), which we rationalize based on the larger relative importance alkyl chain interactions in the adsorption, in the absence of strong dipole interactions.

Thus, strong orientational ordering and large $d_{cc}$ values appear to be primarily associated with molecules containing an orientable zwitterionic headgroup dipole. These effects are stronger for diyne PE, in comparison with other headgroups comprising bulkier substituents.

Figure 2E:
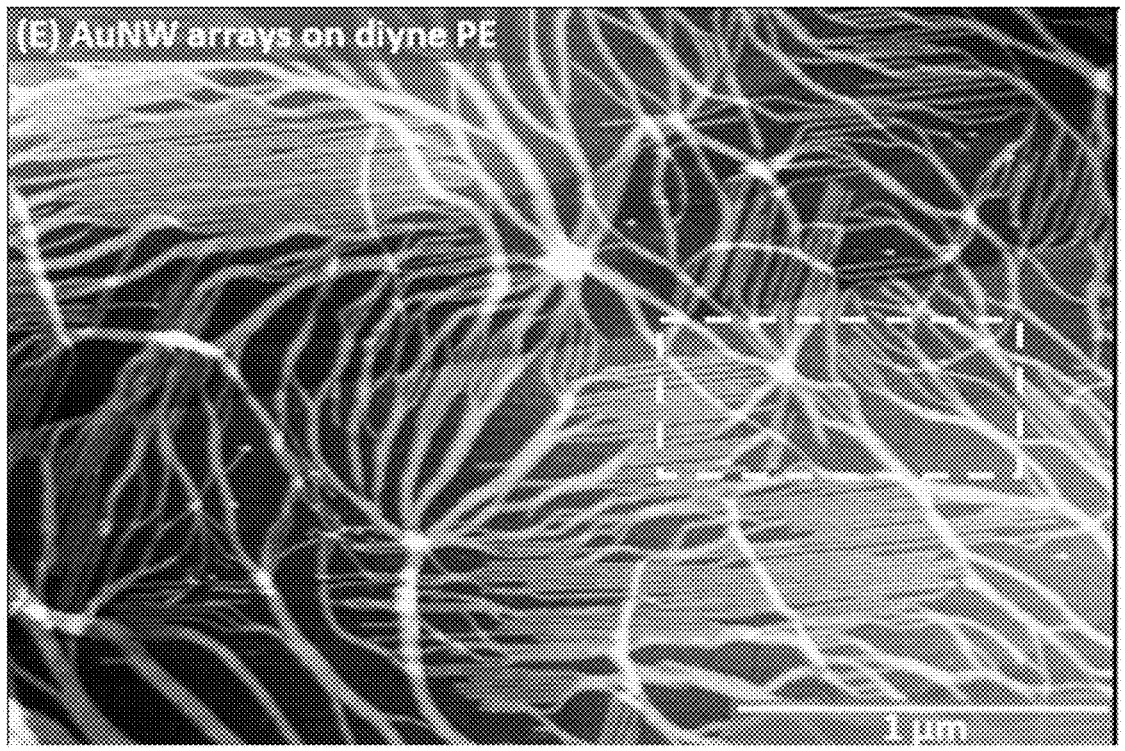
Figure 2F:
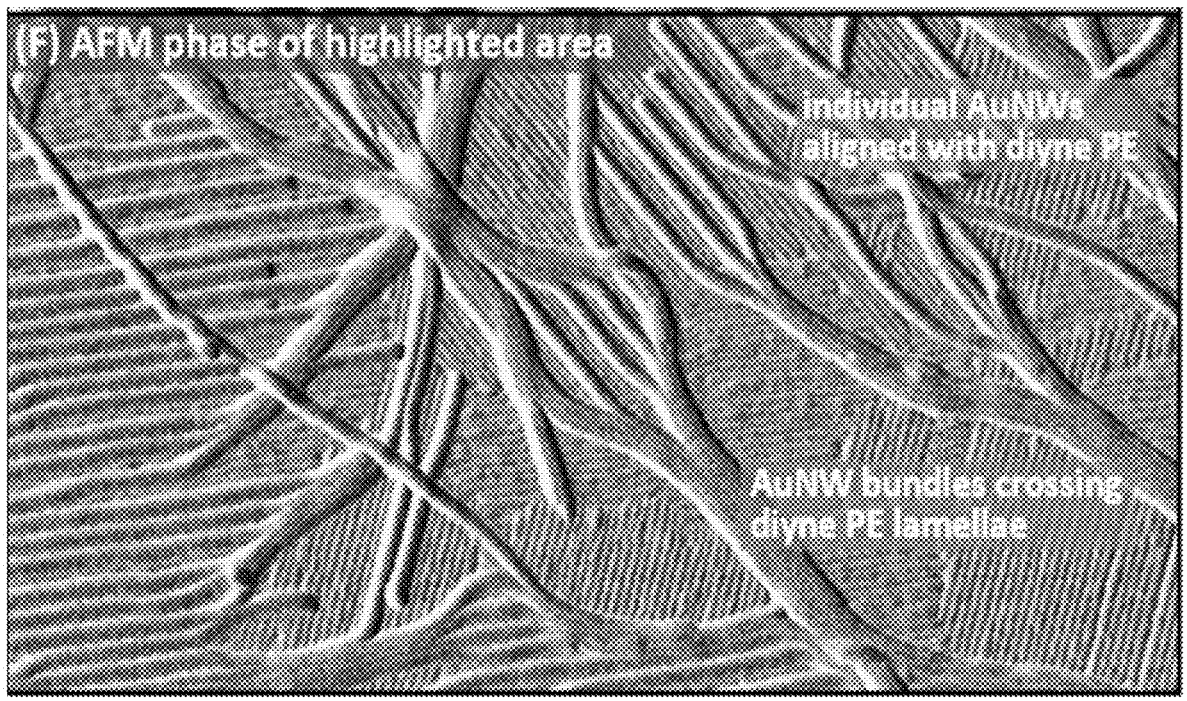

Proposed mechanism for separation of AuNWs on diyne PE templates. AuNWs of this type are known to form bundles in organic solvents due to depletion attraction interactions. In our experiments, they also form such bundles both on bare HOPG (FIG. 2D), and in areas of diyne PE templates in which the AuNW axis does not align with the template axis (FIGS. 2E, 2F). Thus, the separation of the wires in areas of alignment with the template suggests a repulsive interaction between wires that develops as they adsorb to the template and align with rows of phospholipid headgroups. The interactions of charged particles and dipoles in nonpolar media are not entirely well-understood (Hsu, M F., et al., *Langmuir*, 2005, 21, 4881-4887). However, the Bjerrum length for interactions of elementary charged particles in pure cyclohexane is 25-30 nm, suggesting that dipole and/or electrostatic interactions over the observed wire-wire separation distances (14-28 nm) are feasible.

Figure 6A:
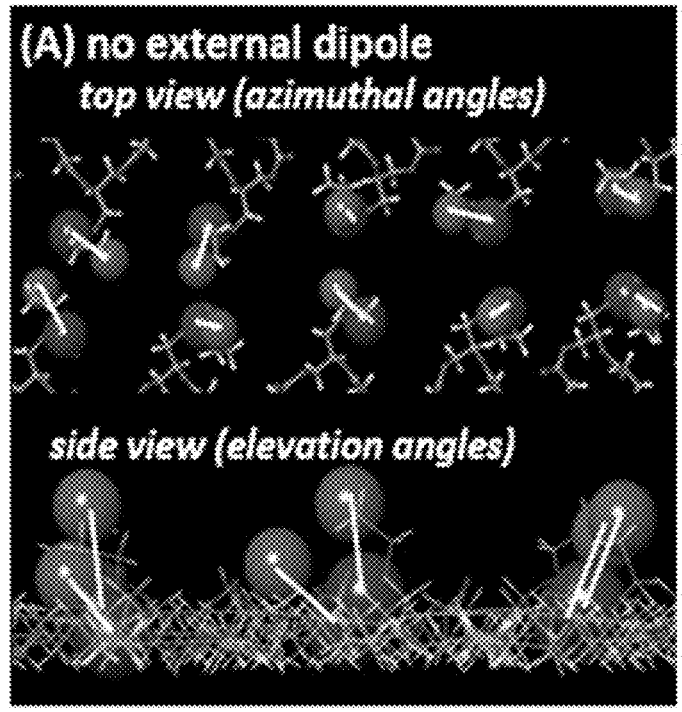
FIGS. 6A-6B show diyne PE headgroup dipole orientation. Molecular dynamics simulations of PE headgroup dipole orientation (FIG. 6A) in absence of external dipole, and (FIG. 6B) in presence of external dipole simulating polarized AuNW.
Figure 6A:
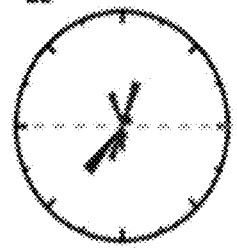
Figure 6A:
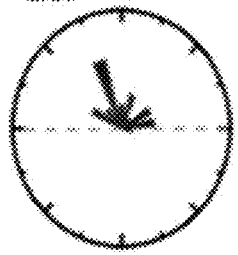

To understand likely phospholipid headgroup dipole orientation in the absence of perturbations (e.g. an adsorbing AuNW), we performed molecular dynamics simulations (FIG. 6A). Rows of diyne PE were simulated in the presence of a layer of explicit water extending 5 Å from the headgroups, with a force field dielectric constant of 2.0 in the surrounding medium, to simulate the cyclohexane solvent environment between the stripes of headgroups. Oleylamine ligands are not treated explicitly in the models, but dielectric constants for long alkyl chains (e.g. $\varepsilon_{dodecane}$=2.0) are similar to those for cyclohexane.

These simulations suggest that in the absence of perturbation by an external field, headgroup dipoles orient at large azimuthal angles relative to the lamellar median (69°±13°; lamellar median direction marked with dashed grey line in windrose plot), and adopt relatively large elevation angles with respect to the substrate (52°±23°; substrate plane marked with dashed grey line in windrose plot). Large elevation angles for the array of headgroup dipoles would be expected to contribute to transverse polarization of AuNWs adsorbing to the interface.

Figure 6B:
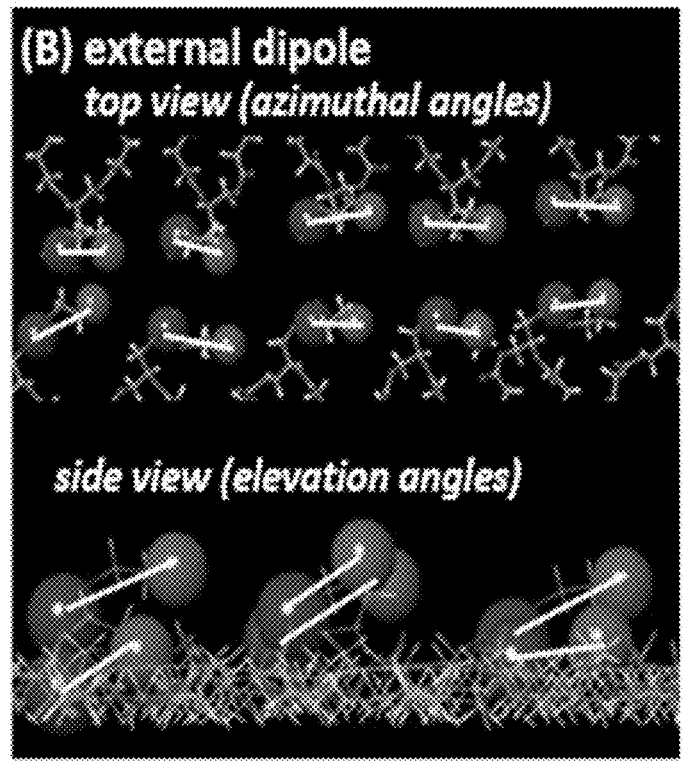
Figure 6B:
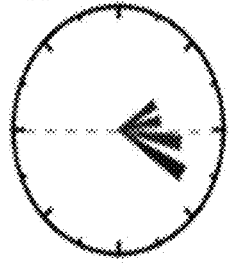
Figure 6B:
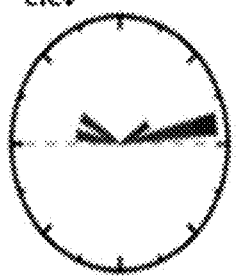

Because longitudinal polarization of AuNWs is typically stronger than transverse polarization (Muskens, O L, et al., *J. Phys. Chem.* C. 2008, 112, 8917-8921), we also examined the impact of a dipole in the environment on rows of diyne PE headgroup dipoles (FIG. 6B). When two point charges positioned outside the edge of the HOPG surface and 1 nm above the HOPG surface are used to simulate a polarized AuNW, PE headgroup dipoles polarize along the lamellar axis (19°±8°), and more parallel to the substrate (16°±8°). Overall, this points to the capacity for diyne PE headgroups to form aligned dipole arrays coupled with objects (e.g. AuNWs) in the environment.

While it is not straightforward to discriminate the relative contributions of the two polarization modes with the techniques used here, overall, we favor the hypothesis that transverse polarization of the wires is a significant contributor to the separation of wires aligned with the template. Under the wire assembly conditions described, transverse polarization should lead to primarily repulsive interactions between wires. Longitudinal polarization would produce either attractive or repulsive interactions, depending on the relative polarization directions of the two wires, presumably leading to sub-populations of wire pairs at 7-nm separation distances.

To conclude, striped phases of diyne phosphoethanolamine presenting nm-wide dipole arrays are capable of precisely orienting and straightening flexible, μm-long gold wires with diameters <2 nm. Creating oriented nanocrystal lattices with spacings dictated by template chemistry rather than ligand shell thickness has potential utility in controlling plasmon coupling and other physical properties.

More broadly, the findings presented here suggest design principles for creating flexible surface templates in which ligands respond collectively to their environment to facilitate oriented binding of an anisotropic object. In biology, phospholipids operate in a relatively polar environment at the membrane periphery. Here, they confer similar utility in nonpolar environments common in inorganic nanocrystal synthesis. The capability of template phospholipids to strongly orient AuNWs depends on the presence of small numbers of water molecules on the surface and the availability of excess simple surfactants in solution. This suggests a minimal environment that may be necessary to recreate collective functions of the polar membrane periphery in a nonpolar environment.

Materials and Methods

Materials. 4-Pentyn-1-amine, silver nitrate, N-bromosuccinimide, copper chloride dihydrate, potassium hydroxide, hydroxylamine hydrochloride, ethylamine, sulfuric acid, sodium thiosulfate, ammonium hydroxide, oleylamine (technical grade, 70%), triisopropylsilane (TIPS, 98%), 3-dimethylamino-1,2-propandiol, N,N'-dicyclohexylcarbodiimide (DCC), 4-(dimethylamino)pyridine (DMAP), sodium iodide, trimethyl phosphite, 2-bromoethanol, trimethylsilyl chloride, anhydrous acetonitrile (MeCN), iodine, and molecular sieves (4 Å) were purchased from Sigma Aldrich (Saint Louis, Mo.) and used as received. 1-Eicosyne and tricosa-10-12-diynoic acid was purchased from GFS Chemicals (Columbus, Ohio) and used as received. Methanol, diethyl ether, dichloromethane (DCM), acetone, dimethylformamide (DMF), ethyl acetate, pyridine, ammonium chloride, sodium bicarbonate, sodium sulfate, magnesium sulfate, and sodium chloride were purchased from Fisher Scientific (Fair Lawn, N.J.) and used as received. Cyclohexane (HPLC grade), dry cyclohexane (99.5% extra dry, Acroseal), and gold tetrachloroauric acid trihydrate (ACS reagent grade) were purchased from Acros Organics (Fair Lawn, N.J.) and used as received. Silica gel was purchased from Machery Nagel (Bethlehem, Pa.) and used as received. 1,2-bis(10,12-tricosadiynoyl)-sn-glycero-3-phosphoethanolamine (diyne PE, >99% purity) and 1,2-bis(10,12-tricosadiynoyl)-sn-glycero-3-phosphocholine (diyne PC, >99% purity) was purchased from Avanti Polar Lipids (Alabaster, Ala.).

Instrumentation. $^1$H NMR spectra were acquired using an INOVA Varian 300 MHz spectrometer with a Varian 5-mm 4-nucleus/BB Z-gradient probe (Scientific Instruments, Palo Alto, Calif.). All atomic force microscopy images were acquired using a Veeco (Bruker Instruments, Billerica, Mass.) MultiMode AFM with NanoScope V controller or an Agilent (Agilent, Palo Alto, Calif.) 5500 AFM.

Synthesis of 1-bromo-1-eicosyne. Synthesis of 1-bromo-1-eicosyne was adapted and described briefly here. In a typical reaction, 1-eicosyne (3.6 mmol) was added to acetone (18 mL), followed by the addition of silver nitrate (0.36 mmol) and N-bromosuccinimide (3.96 mmol). The reaction mixture was stirred for 3 h under ambient conditions, then diluted with 100 mL of hexanes and filtered. The filtrate was reduced in volume and passed through a small silica plug with hexanes. The product was reduced in volume to afford the final product as a colorless oil (typical yield 75%).

Synthesis of 4,6-pentacosadiynamine. 4-pentyn-1-amine (1.92 mmol) was dissolved in a 1 M KOH (aqueous, 1.8 mL) in a round-bottom flask. In a separate vial, methanol (10 mL) was added to hydroxylamine hydrochloride (0.18 mmol). In a second vial, copper chloride dihydrate (0.46 mmol) was dissolved in ethylamine (3 mL). The mixtures in the first and second vials were sequentially added to the round-bottom flask, and the reaction mixture was then cooled to −78° C. Subsequently, a solution of 1-bromo-eicosyne (1.82 mmol) dissolved in THF (3 mL) was added dropwise. The reaction mixture was allowed to warm to room temperature and the reaction continued at that temperature for 24 h. If the solution turned blue, additional aliquots of hydroxylamine hydrochloride were added. The reaction was then quenched by addition of a 10% aqueous solution of sulfuric acid. Crude product was extracted with diethyl ether (3×50 mL) and then washed with water (3×50 mL) and sodium thiosulfate brine (3×50 mL). The organic layer was subsequently dried over anhydrous $Na_2SO_4$, filtered, and the ether removed by rotary evaporator. The product was purified on a silica column with a mobile phase of 9:1 $CHCl_3$:MeOH followed by 2% ammonium hydroxide in 9:1 $CHCl_3$:MeOH.

Synthesis of 3-(dimethylamino)propane-1,2-diyl bis(tricosa-10,12-diynoate). Synthesis of bis-TCD-amine was adapted from previous literature. Filtered 10,12-TCDA (3.54 mmol) was dissolved in 20 ml of DCM. 3-dimethylamino-1,2-propandiol (1.68 mmol), DMAP (0.79 mmol), and DCC (0.73 mmol) where added to the solution while stirring. The reaction was stirred at room temperature for 3 h without exposure to light. The reaction was filtered to removed precipitated dicyclohexylurea, followed by washing twice with 1 M HCl to remove excess DMAP. The organic layer was then collected; water was removed with sodium sulfate, and the remaining liquid was concentrated using rotary evaporation. No further purification was required.

Synthesis of 1,2-bis(10,12-tricosadiynoyl)-sn-glycero-3-choline phosphate. Synthesis of diyne CP was adapted from literature protocol. Bis-TCD-amine (2.28 mmol) from the previous synthetic step above was dissolved in 2:1 DCM: MeOH (6 mL) solution. 2-bromoethanol (11.4 mmol) was added followed by diisopropylethylamine (4.33 mmol). The reaction mixture was stirred at 40° C. for 18 h. The reaction mixture was further diluted with DCM and washed with 1 M HCl twice. The organic layer was dried with sodium sulfate and concentrated. The product was purified via silica column with a mobile phase of 10% MeOH in DCM. The product isolated from the reaction described above (0.34 mmol) was dissolved in 3.4 mL of 5:1 DCM:pyridine solution and stirred over an acetone/dry ice bath. In a second round-bottom flask, I$_2$ (1.36 mmol) was dissolved in 1.4 mL of DCM, after which the solution was placed in an acetone/dry ice bath. Trimethyl phosphite (1.36 mmol) was added slowly to the I$_2$ solution; the solution was stirred until it became colorless. The I$_2$ solution was then added slowly to the first round-bottom flask. The reaction mixture was stirred for 30 min and was subsequently allowed to warm to room temperature. The reaction mixture was then diluted with 50 mL of DCM and washed with 1 M HCl twice. The organic layer was dried over sodium sulfate and concentrated. This material (0.30 mmol) was dissolved in anhydrous MeCN. Catalytic amounts (5%) of NaI were added to the mixture. Trimethylsilyl chloride (1.8 mmol) was slowly added to the mixture at room temperature. The reaction was stirred for an addition 30 min under reflux and then cooled to room temperature. The reaction mixture was concentrated, and methanol was added to the reaction and stirred for 30 min at room temperature. The reaction mixture was concentrated and purified using a silica column with a mobile phase of 35% MeOH:ammonium hydroxide (5:1) in DCM.

Procedure for Langmuir-Schaefer (LS) transfer of amphiphile monolayers. LS deposition was performed using a Kibron (Helsinki, Finland) MicroTrough XL. For transfer of single chain amphiphiles, 12 µL of a 0.75 mg/mL solution of the amphiphile in chloroform was deposited onto a subphase of deionized water at 30° C. The trough was equilibrated for 15 min, to allow the solvent from the spreading solution to evaporate; the trough barriers were then slowly swept inwards at a rate of 6 mm/min. A freshly cleaved HOPG substrate was heated to 45° C. using a custom-built thermally controlled dipping attachment reported previously.[3] When the desired packing density condition for transfer was achieved based on motion of the barriers (75 Å$^2$/chain for the 4,6-PCD-NH$_2$), the HOPG substrate was lowered horizontally into contact with the subphase at a speed of 2 mm/min. Substrates utilized for direct imaging of lamellae were prepared at 3 mN/m (4,6-PCD-NH$_2$) to maximize visibility of lamellar boundaries. After 4 min in contact with the liquid interface, the HOPG was slowly lifted out of contact with the subphase at 2 mm/min.

For phospholipid monolayers, deposition was performed by spreading 40 µL of 0.50 mg/mL solution of phospholipid of choice in chloroform on a subphase of 5 mM MnCl$_2$ at 30° C. After deposition, the trough was allowed to equilibrate for 30 min, in order to allow the solvent from the spreading solution to evaporate. Transfer was carried out at a surface pressure of 30 mN/m (diyne PE and diyne PC), 16.5 mN/m (diyne CP), or 8 mN/m (Bis-TCD-NH$_2$). Freshly cleaved HOPG was heated to 50° C. using the thermally controlled dipping attachment, then lowered into contact with the subphase at 2 mm/min. The HOPG was left in contact with the interface for 2 min and then withdrawn from the interface using the automated dipper.

All samples were dried with N$_2$ prior to further processing. Diacetylene-functionalized amphiphilic monolayers prepared as described above were then photopolymerized for 1 h via irradiation under a 254-nm 8-W UW lamp with approximately 4 cm between sample and lamp.

AuNW growth. AuNW synthetic procedures were adapted from literature protocols. [4-7] In a typical reaction for long wires, 2.5 mg of HAuCl$_4$.3H$_2$O was added to 1.8 mL of dry cyclohexane, followed by 84 µL of oleylamine. Molecular sieves were added to the reaction mixture to remove water. The solution was mixed briefly at room temperature using a vortexer. Triisopropylsilane (120 µL) was added and the solution was mixed again. The reaction mixture was immediately sealed and transferred to a humidity-controlled environmental chamber, and maintained at ambient temperature for 12 h, unless otherwise stated. After the desired aging time the growth solution was diluted 41× (75 uL in 2.5 mL cyclohexane). For wire assembly, HOPG substrates were lowered into contact with the growth solution. HOPG substrates were lifted out of contact with the solution, washed with 1 mL cyclohexane each, and dried with N$_2$. Similar experimental procedures were followed for the synthesis of shorter wires, with the exception that the amount of cyclohexane in the growth solution was increased to 12 mL; these solutions were not diluted further prior to substrate exposure for AuNW assembly. All substrates were stored at 4° C. following wire deposition.

Extraction of nanostructures from AuNW growth solution. Solution-phase reaction products (i.e. AuNWs, AuNSs) were harvested by centrifugation at 6000 rpm for 30 min in a 1:1 cyclohexane/ethanol solvent mixture. This procedure was repeated twice in order remove excess oleylamine and silane. After the final wash, the pellet was redispersed in cyclohexane and stored at 4° C. prior to TEM imaging.

AFM imaging in ambient conditions. AFM imaging was performed under ambient conditions using either a Veeco (Bruker Instruments, Billerica, Mass.) MultiMode AFM or Agilent (Agilent, Palo Alto, Calif.) 5500 AFM. Imaging was performed in tapping mode with Bruker RFESP-75 tips (nominal force constant 3 N/m and radius of curvature <10 nm). Tip broadening was corrected using the equation $$w_0 = w_{exp} - 2(h*[2r_0 - h])^{1/2}$$

wherein $w_0$ is the corrected width, $w_{exp}$ is the experimentally measured width, and $r_o$ is the AFM tip radius of curvature.

AFM imaging in liquid. Liquid cell imaging was performed using an Asylum Cypher ES. Imaging was performed in tapping mode with Mikromasch (Sofia, Bulgaria) XCN12/Cr-Au tips (nominal resonant frequency 67 kHz). All samples were exposed to an environment with the relative humidity conditions stated in the manuscript for 8 h prior to imaging. The sample was immediately placed in the AFM and covered with a 100 µL droplet of cyclohexane (dry) or oleylamine (32 mM) in dry cyclohexane. Samples were imaged in attractive mode to prevent damage to lamellar domain structure.

Characterizing wire properties via image processing. AuNW average lengths, surface coverage, relative orientation, and curvature from AFM images were determined utilizing a Ridge Detection algorithm[8] implemented previously in an Image J plugin, with outputs of the algorithm further modified using custom scripts. AuNW curvature was determined by taking the ratio of wire length to the distance between the wire's two furthest points, which was then mapped onto a range of 0-1, with values close to 0 indicating low degrees of curvature. After the curvature was established, the wires with values greater than 0.05 were eliminated, and the relative angles between wires was calculated through the use of the representative vector. Surface densities of AuNW (µm of AuNW contour length per µm$^2$ of substrate area) were determined by using the ridge detection algorithm to identify the contour length of each wire visible within an image. Inter-wire spacings were measured from Gwyddion line scans and compiled into histograms. At least 3 images (typically 3 µm×3 µm) were analyzed for each data point graphed; at least 175 center-to-center distances were measured for each histogram.

TEM Imaging. All TEM imaging was performed on a Tecnai G2 20 (Thermo Fisher Scientific, Hillsboro, Oreg.) with an accelerating voltage of 200 kV and a lanthanum hexaboride (LaB6) filament. TEM samples were prepared by depositing 6 µL of redispersed gold nanowire solution on a 200 mesh C/Cu grid (Ted Pella, Redding, Calif.). The solution was wicked from the grid after 10 s.

SEM Imaging. High resolution imaging of surface-templated AuNW arrays under high magnification was performed using a Teneo VS SEM (FEI Company, Hillsboro, Oreg.) at a working distance of ~5.0 mm using the in-column Trinity detector T3. Beam currents in the range of 0.20-0.80 nA were selected for best resolution image acquisition through a 32 µm diameter aperture with an accelerating voltage of 5.00 kV. All substrates were affixed to standard SEM pin stub specimen mounts with conductive carbon tape. To further enhance substrate-mount conductivity, a small amount of colloidal silver paint (PELCO®, Ted Pella, Inc.) was applied along the perimeter of the HOPG from the face down to the pin stub.

Energy minimization. Software packages Maestro and Macromodel (Schrödinger, Cambridge Mass.) were used, respectively, to visualize molecular structures and to perform force field minimizations. Models of lamellar structures were minimized using the OPLS_2005 force field, with normal cutoffs for van der Waals, electrostatic and hydrogen bonding interactions. Minimizations were performed using the Polak-Ribiere conjugate gradient (PRCG) algorithm and gradient method with 50000 runs and a convergence threshold of 0.05.

AFM images comparing AuNW assembly on diyne PE, 4,6-PCD-$NH_2$, and bare HOPG. In the main manuscript, FIGS. 2A-2F show AFM images of AuNWs assembled on a diyne PE template and on bare HOPG. Here, we additionally show results of assembling AuNWs on 4,6-PCD-$NH_2$, which lacks a headgroup dipole. Line scans across groups of wires on diyne PE and 4,6-PCD-$NH_2$ in the bottom panel illustrate that the local center-to-center distance on diyne PE is 15 nm (approximately 2× the template pitch, while the center-to-center distance on 4,6-PCD-$NH_2$ is 7 nm (similar to the template pitch). On bare HOPG, bundles of wires are observed; in some cases, filled vacancies between wire bundles appear to be domains of standing phase OM.

SEM images of AuNW assembled on diyne PE templates.

Figure 3G:
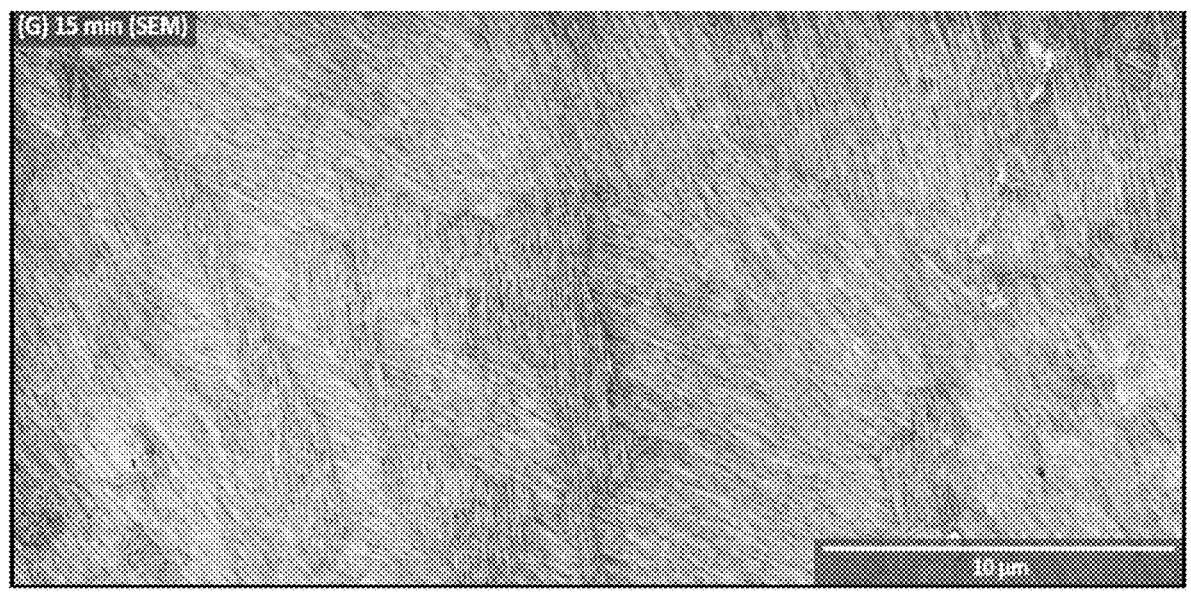

FIG. 3G shows an SEM image of AuNWs assembled on a diyne PE template.

Figure 7A:
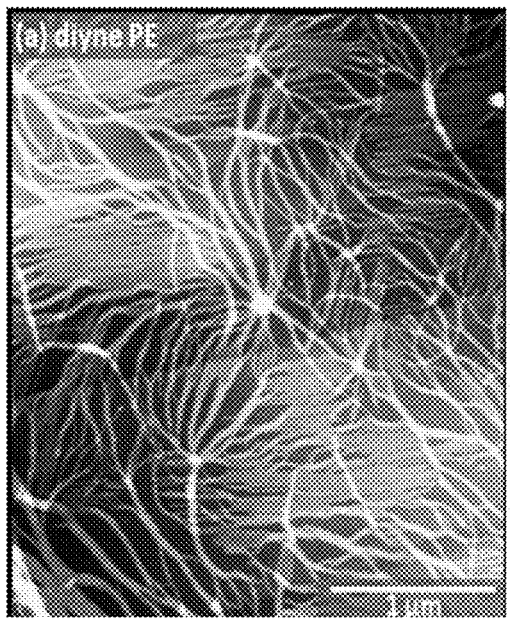
FIGS. 7A-7G show comparison of long AuNW assembly on template substrates. AFM images of AuNW assembled on (FIGS. 7A and 7B are shown at different scales) a striped diyne PE template, (FIGS. 7C and 7D at different scales) a 4,6-PCD-$NH_2$ template, and (FIGS. 7E and 7F at different scales) bare HOPG.
Figure 7B:
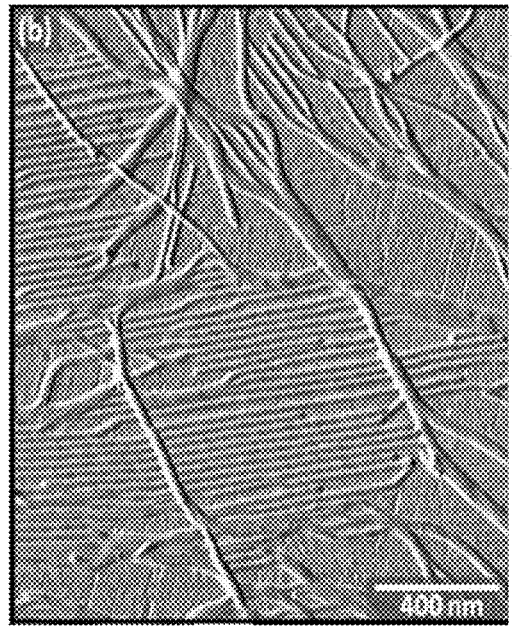
Figure 7C:
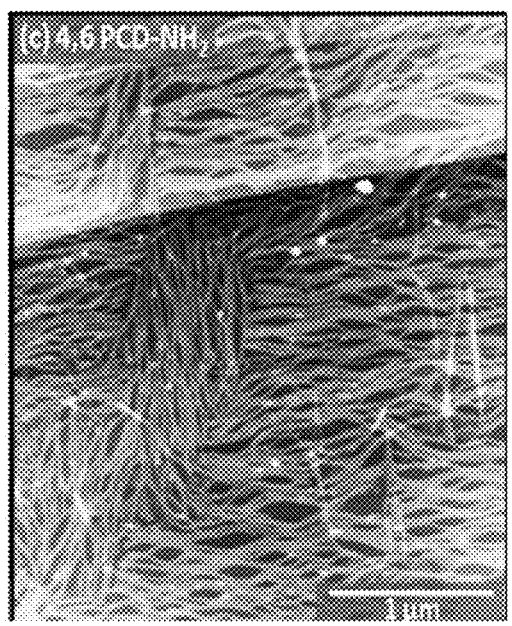
Figure 7D:
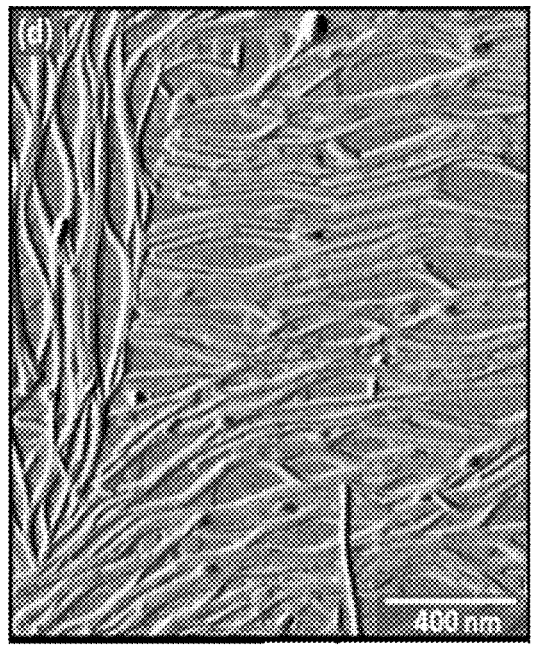
Figure 7E:
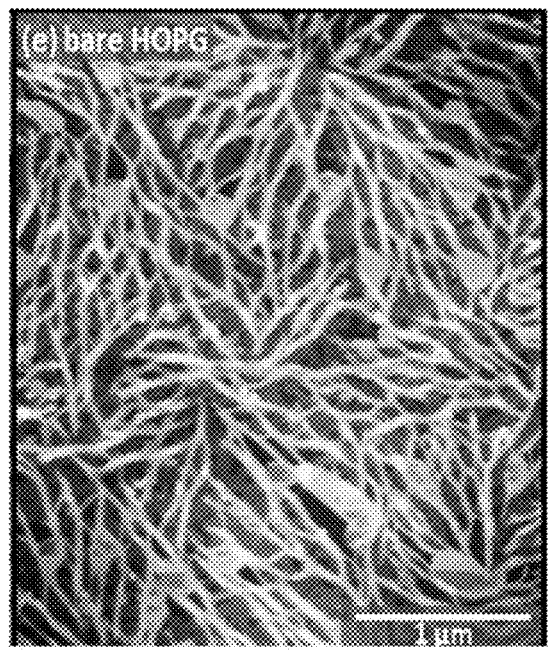
Figure 7F:
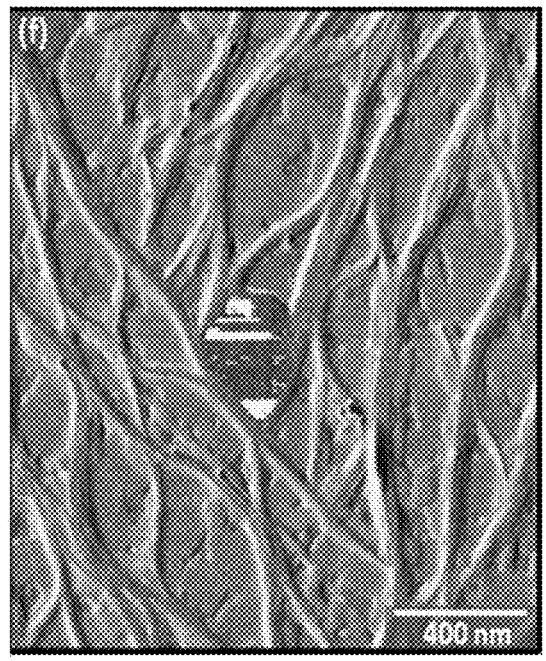
Figure 7G:
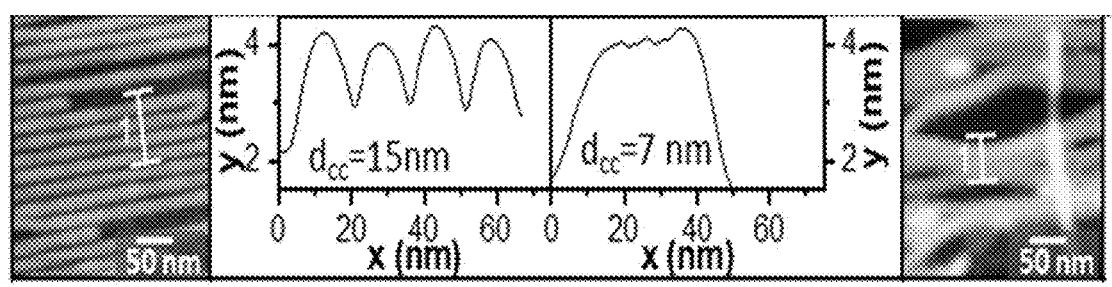

FIGS. 7A-7G (was Fig. S1) show comparison of long AuNW assembly on template substrates. AFM images of AuNW assembled on (FIGS. 7A and 7B at different scales) a striped diyne PE template, (FIGS. 7C and 7D at different scales) a 4,6-PCD-$NH_2$ template, and (FIGS. 7E and 7F at different scales) bare HOPG. In FIG. 7G, line scans taken from images (FIG. 7A) and (FIG. 7B) illustrate the difference in center-to-center distance for wires assembled on diyne PE and 4,6-PCD-$NH_2$.

Figure 8:
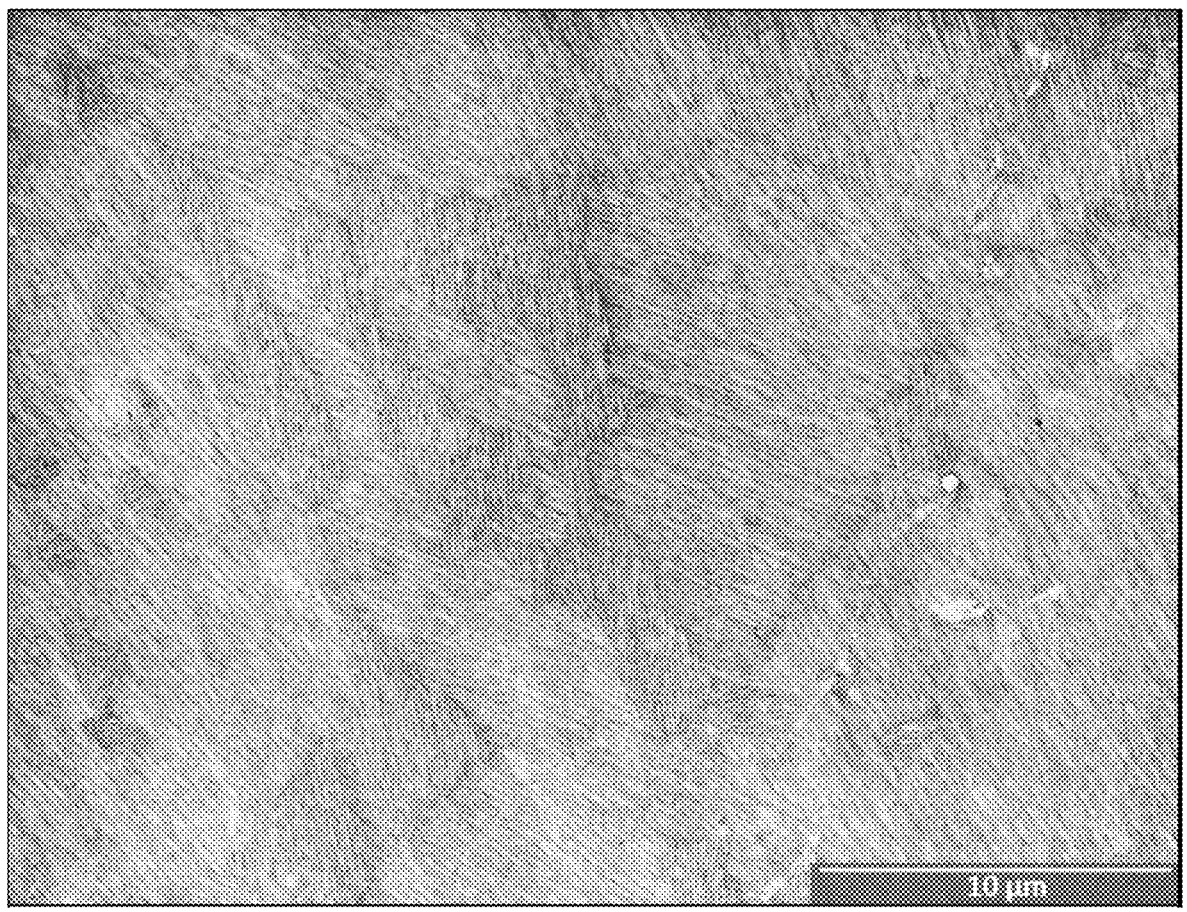
FIG. 8 is a large-area SEM image of AuNWs assembled on diyne PE template.
Figure 9:
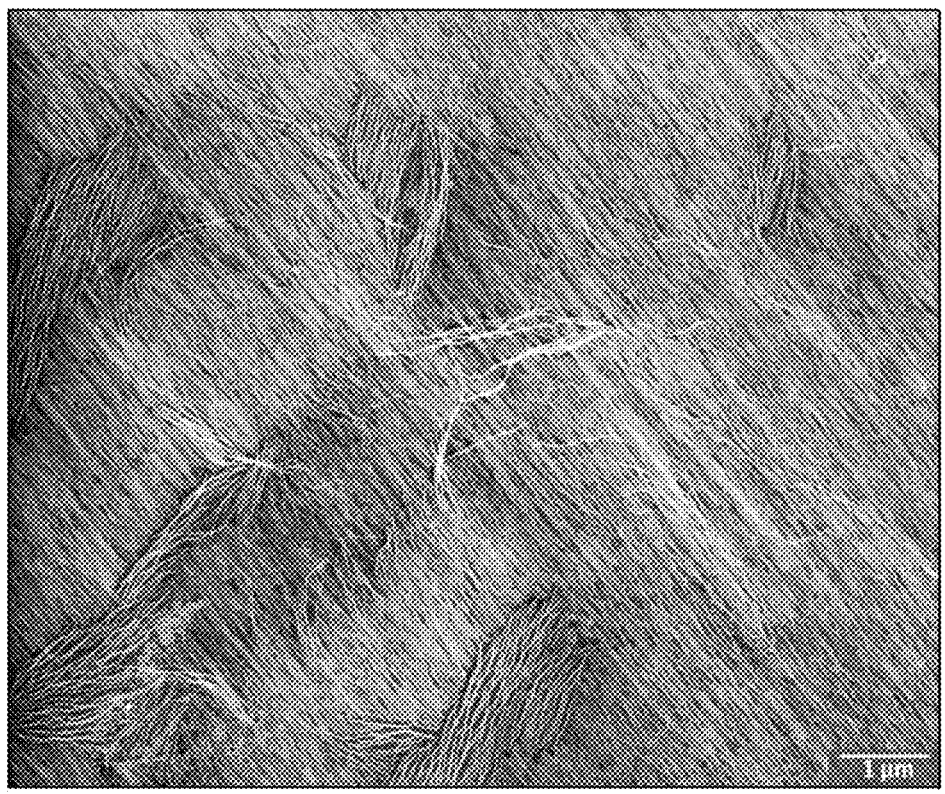
FIG. 9 shows higher-resolution SEM image of AuNW on diyne PE.
Figure 10:
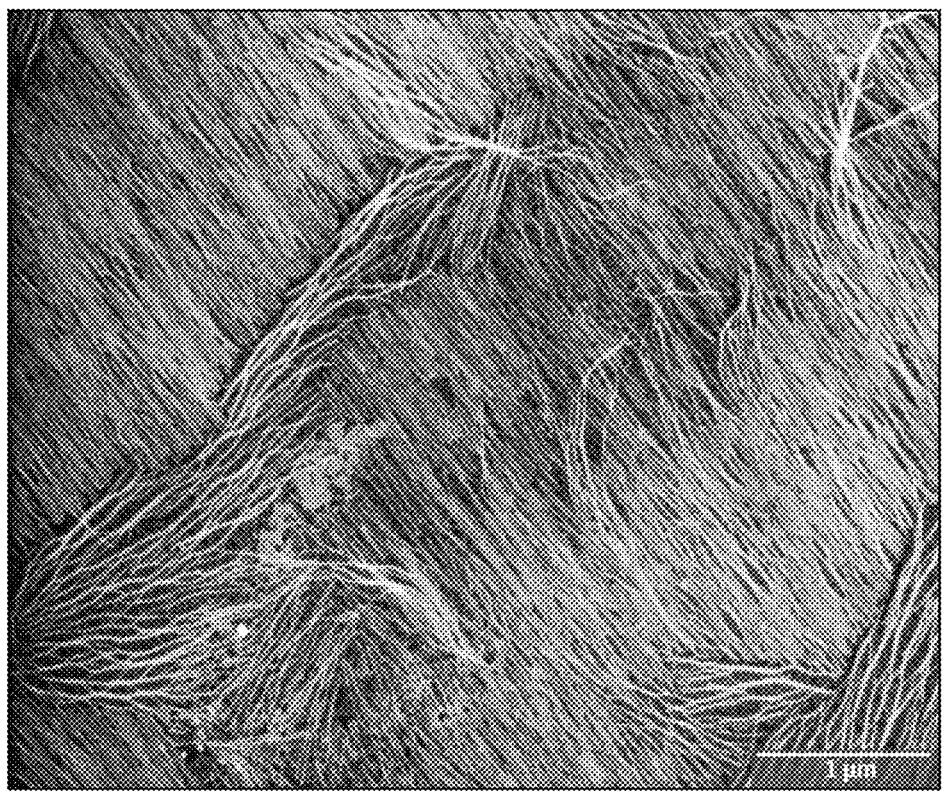
FIG. 10 shows high-resolution SEM image of AuNW on diyne PE illustrating differences in wire grouping when wires align with or across the template stripe direction.

Here the original image is shown at larger scale (FIG. 8), as well as higher-resolution images (FIGS. 9 and 10) of similar areas that illustrate the separation of the AuNWs on the surface, as well as the difference in AuNW grouping when the AuNW long axes are aligned along vs. across the template stripe direction.

Those skilled in the art will recognize that numerous modifications can be made to the specific implementations described above. The implementations should not be limited to the particular limitations described. Other implementations may be possible.

It is intended that the scope of the present methods and apparatuses be defined by the following claims. However, it must be understood that this disclosure may be practiced otherwise than is specifically explained and illustrated without departing from its spirit or scope. It should be understood by those skilled in the art that various alternatives to the embodiments described herein may be employed in practicing the claims without departing from the spirit and scope as defined in the following claims.

What is claimed is:

1. A method for preparing an array of ultra-narrow nanowires or nanorods on a non-covalently functionalized supporting 2D material substrate comprising the steps of
   a. preparing a polymerizable amphiphile comprising both hydrophobic and hydrophilic constituents;
   b. preparing a supporting 2D material substrate;
   c. preparing a monolayer or thin film of said polymerizable amphiphile on said supporting 2D material substrate, wherein said hydrophobic and hydrophilic constituents of the polymerizable amphiphile are exposed in such a way to form a striped pattern of nanometer scale;
   d. polymerizing said amphiphile monolayer to afford a polymerized monolayer or thin film on said supporting 2D material substrate to afford a non-covalently functionalized supporting 2D material substrate;
   e. curing said amphiphilic monolayer in an environment with controlled humidity;
   f. preparing a salt solution or suspension and growing nanowires or nanorods in the salt solution; and
   g. exposing said nanowires or nanorods to said polymerized amphiphile monolayer or thin film on said supporting 2D material substrate, whereby an oriented array of said nanowires or nanorods is produced.

2. The method of claim 1, wherein said metal salt is a gold or silver salt.

3. The method of claim 1, wherein said salt solution or suspension comprises a non-polar solvent or a mixture thereof.

4. The method of claim 1, wherein said salt solution or suspension comprises cyclohexane, oleylamine, triisopropylsilane, and a gold or silver salt.

5. The method of claim 4, wherein said gold salt is $HAuCl_4$ having a concentration of about 0.1-10 mM.

6. The method of claim 4, wherein said salt solution comprises oleylamine of about 1-1000 mM and triisopropylsilane of about 10-1000 mM.

7. The method of claim 1, wherein said polymerization of an amphiphile monolayer or thin film is performed by irradiating with an UV light.

8. The method of claim 1, wherein said supporting 2D material substrate is graphene, highly oriented pyrolytic graphite (HOPG), or a layered material comprising $MoS_2$ or $WS_2$.

9. The method of claim 1 wherein said polymerizable amphiphile is a single-chain fatty amine or dual-chain phospholipid with a terminal amine, or other polymerizable amphiphile with a polar headgroup including functionalities such as a carboxylic acid, phosphate, or thiol.

10. The method of claim 9, wherein said polymerizable single-chain amphiphile is 4,6-pentacosadiyneamine or 10,12-pentacosa-diynamine.

11. The method of claim 9, wherein said dual-chain amphiphile is 1,2-bis(10,12-tricosadiynoyl)-sn-glycero-3-phosphocholine (diyne PC), 1,2-bis(10,12-tricosadiynoyl)-sn-glycero-3-phosphoethanolamine (diyne PE), or other like polymerizable amphiphile.

12. An array of nanowires or nanorods prepared according to the method of claim 1.

13. An array of ultra-narrow nanowires or nanorods on a non-covalently functionalized supporting 2D material substrate manufactured according to the steps of
   a. preparing a polymerizable amphiphile comprising both hydrophobic and hydrophilic constituents;
   b. preparing a supporting 2D material substrate;
   c. preparing a monolayer or thin film of said polymerizable amphiphile on said supporting 2D material substrate, wherein said hydrophobic and hydrophilic constituents of the polymerizable amphiphile are exposed in such a way to form a striped pattern of nanometer scale;
   d. polymerizing said amphiphile monolayer to afford a polymerized monolayer or thin film on said supporting 2D material substrate to afford a non-covalently functionalized supporting 2D material substrate;
   e. curing said amphiphilic monolayer in an environment with controlled humidity;
   f. preparing a salt solution or suspension and growing nanowires or nanorods in the salt solution; and
   g. exposing said nanowires or nanorods to said polymerized amphiphile monolayer or thin film on said supporting 2D material substrate, whereby an oriented array of said nanowires or nanorods is produced.

14. An array of nanowires or nanorods prepared according to claim 13, wherein said metal salt is a silver or gold salt having a concentration of about 0.1-10 mM.

15. An array of nanowires or nanorods prepared according to claim 13, wherein said supporting 2D material substrate is graphene, highly oriented pyrolytic graphite (HOPG), or a layered material comprising $MoS_2$ or $WS_2$.

16. An array of nanowires or nanorods prepared according to claim 13, wherein said salt solution or suspension comprises a non-polar solvent or a mixture thereof.

17. An array of nanowires or nanorods prepared according to claim 13, wherein said salt solution or suspension comprises cyclohexane, oleylamine, triisopropylsilane, and a gold or silver salt.

18. An array of nanowires or nanorods prepared according to claim 13, wherein said salt solution comprises oleylamine of about 1-1000 mM and triisopropylsilane of about 10-1000 mM.

19. An array of nanowires or nanorods prepared according to claim 13, wherein said polymerization of an amphiphile monolayer or thin film is performed by irradiating with an UV light.

20. An array of nanowires or nanorods prepared according to claim 13, wherein said polymerizable amphiphile is a single-chain fatty amine, a dual-chain phospholipid with a terminal amine, or other polymerizable amphiphile with a polar headgroup including functionalities such as a carboxylic acid, phosphate, or thiol.

* * * * *